United States Patent
Riho et al.

(10) Patent No.: US 8,116,156 B2
(45) Date of Patent: Feb. 14, 2012

(54) SEMICONDUCTOR MEMORY DEVICE

(75) Inventors: Yoshiro Riho, Tokyo (JP); Atsushi Fujikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 162 days.

(21) Appl. No.: 12/320,891

(22) Filed: Feb. 6, 2009

(65) Prior Publication Data

US 2009/0201752 A1    Aug. 13, 2009

(30) Foreign Application Priority Data

Feb. 8, 2008 (JP) ................................ 2008-028830
Oct. 20, 2008 (JP) ................................ 2008-269382

(51) Int. Cl.
*G11C 29/00* (2006.01)

(52) U.S. Cl. ............... 365/200; 365/230.06; 365/225.7

(58) Field of Classification Search .............. 365/200, 365/230.06, 225.7, 230.03, 189.07, 189.03, 365/185.09, 185.33
See application file for complete search history.

(56) References Cited

U.S. PATENT DOCUMENTS

| | | | |
|---|---|---|---|
| 5,862,086 A * | 1/1999 | Makimura et al. | ............ 365/200 |
| 6,205,064 B1 | 3/2001 | Ooishi | |
| 6,272,057 B1 | 8/2001 | Koshikawa | |
| 6,333,878 B2 | 12/2001 | Ooishi | |
| 6,414,887 B2 | 7/2002 | Koshikawa | |
| 2001/0026967 A1 * | 10/2001 | Koshikawa | ................ 438/200 |
| 2001/0050871 A1 * | 12/2001 | Takase et al. | ................ 365/201 |
| 2002/0054518 A1 * | 5/2002 | Ooishi et al. | ................ 365/200 |
| 2004/0145939 A1 * | 7/2004 | Yoshida et al. | ................ 365/145 |
| 2006/0034142 A1 * | 2/2006 | Ooishi et al. | ............ 365/230.06 |
| 2009/0201753 A1 * | 8/2009 | Riho et al. | ................ 365/200 |

FOREIGN PATENT DOCUMENTS

| | | |
|---|---|---|
| JP | 06-314498 | 11/1994 |
| JP | 2000-268596 A | 9/2000 |
| JP | 2000-293998 A | 10/2000 |

* cited by examiner

*Primary Examiner* — Dang T Nguyen

(74) *Attorney, Agent, or Firm* — Foley & Lardner LLP

(57) ABSTRACT

There are provided a row predecoder that predocodes an address irrespective of whether the address to which access is requested is a defective address, a row main decoder that controls a sub-word driver, based on a predecode signal generated by the row predecoder, and a repair determining circuit that determines whether the address is a defective address. The row main decoder, the row predecoder, and the repair determining circuit all have a shape in which a column direction is set to be a longitudinal direction. The row predecoder and the repair determining circuit are arranged adjacent to each other in the column direction, and are arranged in parallel with the row main decoder.

9 Claims, 30 Drawing Sheets

SEMICONDUCTOR MEMORY DEVICE

BACKGROUND OF THE INVENTION

1. Field of the Invention

The present invention relates to a semiconductor memory device, and more particularly relates to a layout of a semiconductor memory device having a redundant memory cell that replaces a defective normal memory cell.

2. Description of Related Art

Because a semiconductor memory device represented by DRAM (Dynamic Random Access Memory) has many memory cells, it is difficult to manufacture all the memory cells without a defect. Thus, besides normal memory cells, redundant memory cells that can replace the normal memory cells when they are defective are generally prepared beforehand (see Japanese Patent Application Laid-open Nos. 2000-268596 and H6-314498). Such a semiconductor memory device uses a repair determining circuit for determining whether an address to which access is requested is a defective address, and a redundant driver circuit for accessing a redundant memory cell when the address is determined as a defective address by the repair determining circuit.

First, when an address is supplied from outside, whether the address is a defective address is determined by the repair determining circuit. Subsequently, either a driver circuit or a redundant driver circuit starts operating based on the result of the determination, and thereby, the access is executed to one of the normal memory cell and the redundant memory cell.

However, determination by the repair determining circuit takes a relatively long time. Thus, for example, in a DRAM, there is a problem that a period tRCD from inputting of an active command indicating an input timing of a row address until inputting of a read or write command indicating an input timing of a column address is rate-controlled by a determining operation performed by the repair determining circuit, and thus a random RAS access is delayed.

To solve such a problem, there is a method for a parallel execution of some of access operations to the normal memory cells and the determining operation by the repair determining circuit (see Japanese Patent Application Laid-open No. 2000-293998). According to this method, the access speed at the row side is improved, and thus the period tRCD can be shortened. In the case where a defective address is detected by the repair determining circuit, the normal memory cells are not accessed, thereby preventing a state that a plurality of memory cells are selected simultaneously. Specifically, after activating a main word line and before activating a sub-word line, only the sub-word lines corresponding to the redundant memory cells are activated by resetting the main word lines corresponding to the normal memory cells.

As described above, in a general semiconductor memory device, the determining operation by the repair determining circuit is performed first, and after its completion, the decode operation by the predecoder is performed. Thus, it is general that the repair determining circuit is placed near an address latch circuit while the predecoder is arranged near a main decoder. However, in a case of the semiconductor memory device described in Japanese Patent Application Laid-open No. 2000-293998, there is a problem that when some of the access operations to the normal memory cells are executed in parallel with the determining operation by the repair determining circuit, the distance from the repair determining circuit to the main decoder becomes considerably long as compared to the distance from the predecoder to the main decoder when the general layout, is adopted, and the effect of the high-speed access realized by the parallel operation is reduced.

SUMMARY

The present invention seeks to solve one or more of the above problems, or to improve upon those problems at least in part.

In one embodiment, there is provided a semiconductor memory device comprising: a memory cell array including a normal memory cell and a redundant memory cell that replaces the normal memory cell when it is defective; a first sub-word driver that selects the normal memory cell; a second sub-word driver that selects the redundant memory cell; a predecoder that predecodes an address to which access is requested irrespective of whether the address is a defective address; a main decoder that controls the first and second sub-word drivers based on a predecode signal generated by the predecoder; and a repair determining circuit that determines whether the address to which access is requested is the defective address, wherein the main decoder, the predecoder, and the repair determining circuit all have a shape in which a first direction is set to be a longitudinal direction, and the predecoder and the repair determining circuit are arranged adjacent to each other in the first direction, and are arranged in parallel with the main decoder.

It is preferable that the memory cell array is divided into a plurality of memory mats. In this case, it is preferable that the second sub-word driver accesses the redundant memory cell belonging to a memory mat different from a memory mat including the normal memory cell indicated by the address to which access is requested.

According to the present invention, the distance from the predecoder to the main decoder, and the distance from the repair determining circuit to the main decoder are almost the same, and thus in a semiconductor memory device in which the access operation to the normal memory cells is performed in parallel with the determining operation by the repair determining circuit, the high-speed access by the parallel operation can be performed effectively. Thereby, the access speed can be further improved.

By allocating the defective normal memory cells and the redundant memory cells that replace these cells in memory mats different to each other, it becomes possible to perform the actual access operations to the normal memory cells concurrently with the determining operation by the repair determining circuit. For example, it becomes also possible to activate the sub-word line corresponding to the defective normal memory cell, as well as the sub-word line corresponding to the redundant memory cell. Thus, as compared to the conventional technique, the access speed can be further improved.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
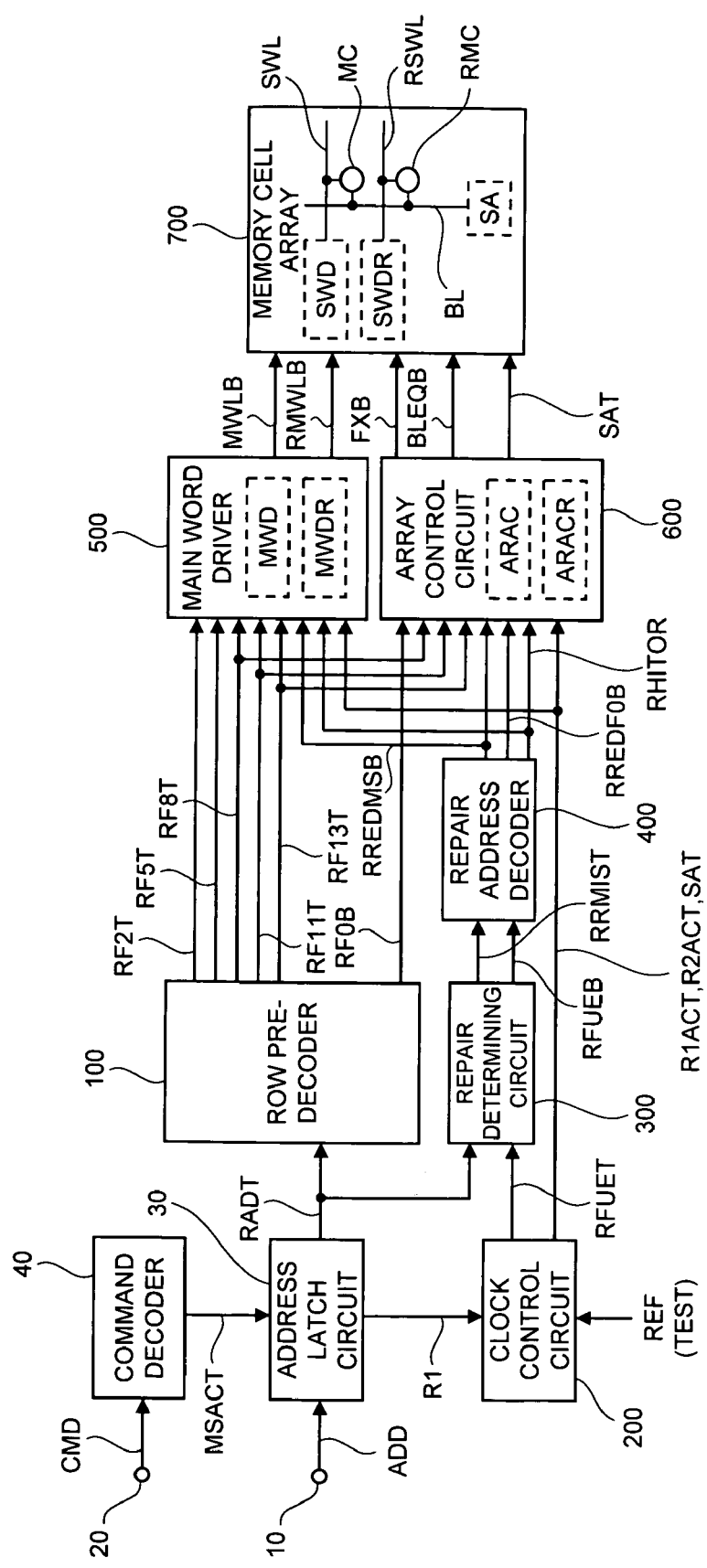
FIG. 1 is a block diagram showing a configuration of main parts of a semiconductor memory device according to a preferred embodiment of the present invention.

FIG. 1 is a block diagram showing a configuration of main parts of a semiconductor memory device according to a preferred embodiment of the present invention.

Although not particularly limited, the semiconductor memory device according to the present embodiment is a DRAM (Dynamic Random Access Memory). The DRAM includes a row system circuit that performs an access operation based on a row address and a column system circuit that performs an access operation based on a column address. In FIG. 1, out of the both circuits, only the row system circuit related to the present invention is shown. This is because an object of the semiconductor memory device according to the embodiment is to increase the speed of a random RAS access by shortening a period (tRCD) from inputting of an active command indicating a supply timing of a row address until inputting of a read or write command indicating a supply timing of a column address, thereby primarily ameliorating a row circuit as compared to the conventional technique.

As shown in FIG. 1, in the semiconductor memory device according to the present embodiment, an address terminal 10 to which an address signal ADD is inputted and a command terminal 20 to which a command signal CMD is inputted are arranged. A data input/output terminal, a power supply terminal or the like are also included as other external terminals. However, these components are omitted in FIG. 1.

The address signal ADD inputted to the address terminal 10 is fetched to an address latch circuit 30. Out of the address signal ADD fetched to the address latch circuit 30, a row address RADT is supplied to a row predecoder 100. Although not particularly limited, the row address RADT is a 14-bit signal. The command signal CMD inputted to the command terminal 20 is decoded by a command decoder 40, and various internal commands are generated. Out of the various internal commands, an active signal MSACT is supplied to the address latch circuit 30, and thereby, the operation of the address latch circuit 30 is controlled.

Figure 2:
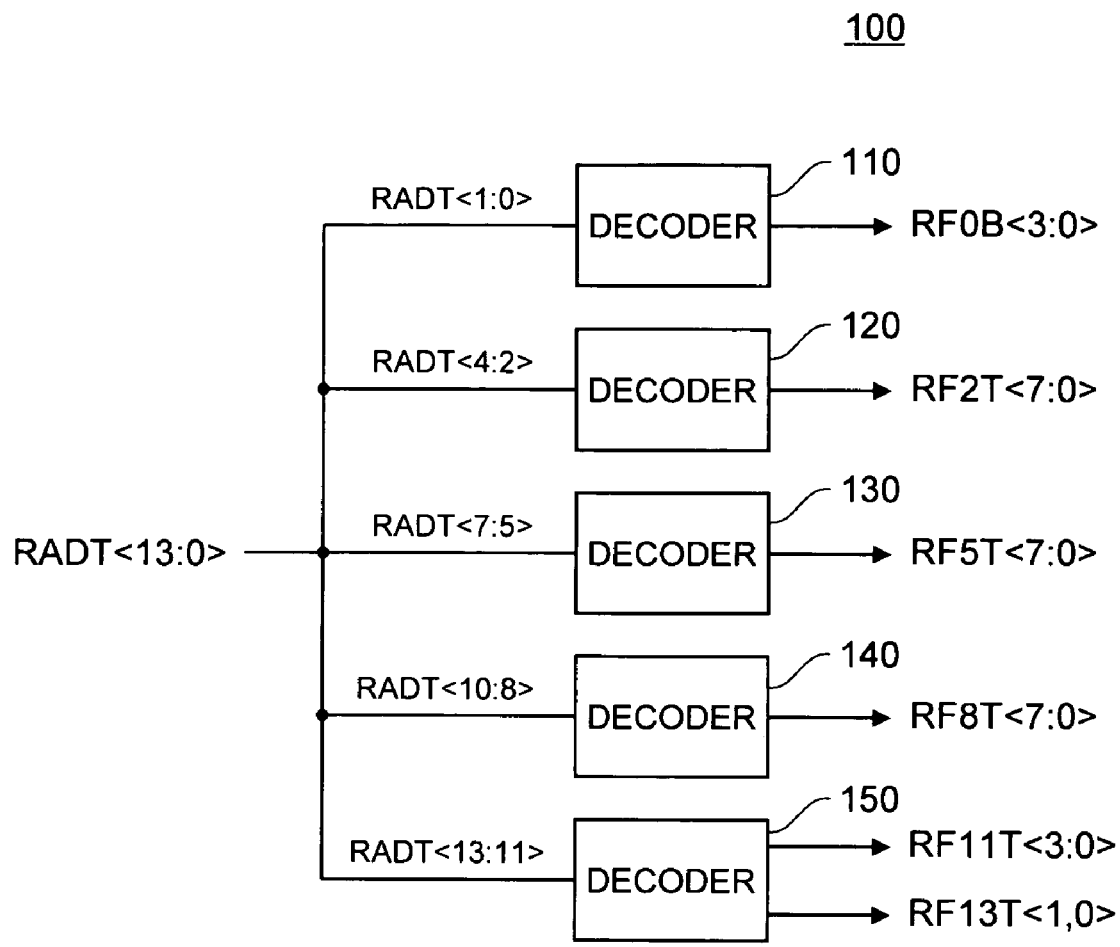
FIG. 2 is a circuit diagram of a row predecoder shown in FIG. 1.

FIG. 2 is a circuit diagram of the row predecoder 100.

As shown in FIG. 2, the row predecoder 100 is configured by five decoders 110, 120, 130, 140, and 150. The row address RADT predecoded by the row predecoder 100 is a 14-bit signal, and is written as RADT<13:0> in FIG. 2. This means that the row address RADT is a 14-bit signal constituted by RADT<13> to RADT<0>.

The five decoders 110, 120, 130, 140, and 150 configuring the row predecoder 100 decode a 2-bit RADT<1:0>, a 3-bit RADT<4:2>, a 3-bit RADT<7:5>, a 3-bit RADT<10:8>, and a 3-bit RADT<13:11> of the row address, respectively. Thereby, the decoder 110 generates a 4-bit predecode signal RFOB<3:0>, the decoder 120 generates an 8-bit predecode signal RF2T<7:0>, the decoder 130 generates an 8-bit predecode signal RF5T<7:0>, the decoder 140 generates an 8-bit predecode signal RF8T<7:0>, and the decoder 150 generates a 4-bit predecode signal RF11T<3:0> and a 2-bit predecode signal RF13T<1:0>.

These predecode signals are supplied to a main word driver 500 and an array control circuit 600, as shown in FIG. 1. Although the detail is described later, the main word driver 500 includes two types of main word drivers MWD and MWDR, and the array control circuit 600 includes two types of control circuits, ARAC and ARACR. The main word driver MWD and the control circuit ARAC are circuits for accessing a normal memory cell MC, and the main word driver MWDR and the control circuit ARACR are circuits for accessing a normal memory cell MC or a redundant memory cell RMC.

On the other hand, the address latch circuit 30 synchronizes with an output timing of the row address RADT to generate a timing signal R1. The timing signal R1 is supplied to a clock control circuit 200 shown in FIG. 1.

Figure 3:
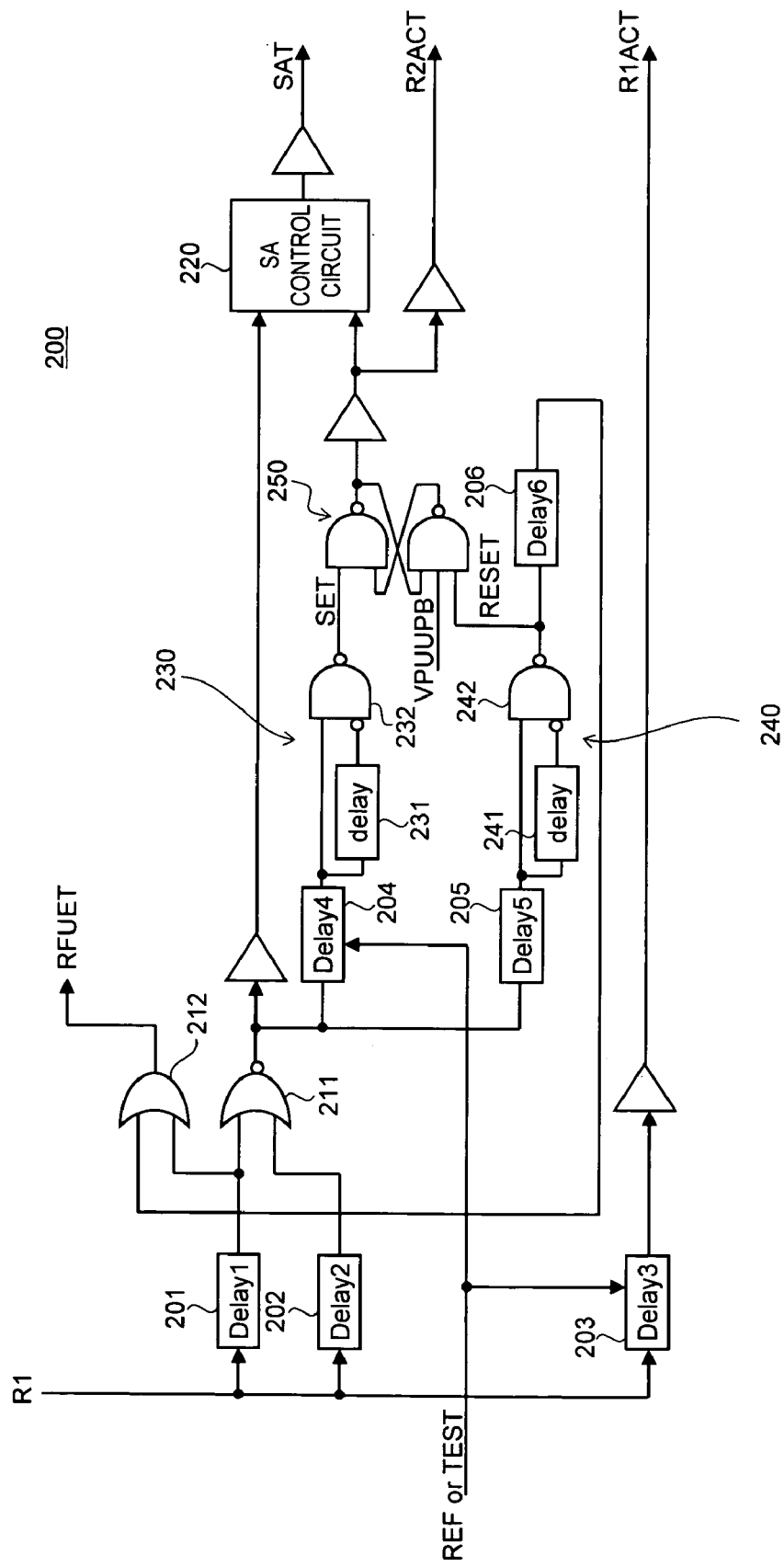
FIG. 3 is a circuit diagram of a clock control circuit shown in FIG. 1.

FIG. 3 is a circuit diagram of the clock control circuit 200.

As shown in FIG. 3, the clock control circuit 200 includes delay circuits 201 to 203 that delay the timing signal R1. Output of the delay circuit 203 is outputted as a timing signal RLACT, and supplied to the array control circuit 600 as shown in FIG. 1. On the other hand, outputs of the delay circuits 201 and 202 are supplied to an NOR circuit 211. Output of the NOR circuit 211 is supplied to a sense-amplifier control circuit 220 as a sense stop signal SAOFFT, and also supplied to the delay circuits 204 and 205.

Output of the delay circuit 204 is supplied to a pulse generating circuit 230 constituted by the delay circuit 231 and the NAND circuit 232. Output of the pulse generating circuit 230 is supplied to a flip-flop circuit 250 so that the flip-flop circuit 250 is changed to a set state. On the other hand, output of the delay circuit 205 is supplied to a pulse generating circuit 240 constituted by a delay circuit 241 and a NAND circuit 242. Output of the pulse generating circuit 240 is supplied to the flip-flop circuit 250 so that the flip-flop circuit 250 is changed to a reset state.

Output of the flip-flop circuit 250 is supplied to the sense-amplifier control circuit 220, and also outputted as a timing signal R2ACT. The timing signal R2ACT is supplied to the array control circuit 600 shown in FIG. 1. The sense-amplifier control circuit 220 activates a sense-amplifier operation signal SAT in response to the output of the flip-flop circuit 250, and also inactivates the sense-amplifier operation signal SAT in response to the sense stop signal SAOFFT. As described later, the sense-amplifier operation signal SAT includes timing signals SAP1T, SAP2T, and SAN.

The output of the pulse generating circuit 240 is supplied also to the delay circuit 206. Outputs of the delay circuits 201 and 206 are supplied to an OR circuit 212. Output of the OR circuit 212 is supplied, as a fuse enable signal RFUET, to a repair determining circuit 300 shown in FIG. 1.

As shown in FIG. 3, a refresh signal REF is supplied to delay circuits 203 and 204. The delay circuits 203 and 204 perform a delay operation when the refresh signal REF is activated, i.e., when the delay circuits 203 and 204a are in a refresh mode. When the refresh signal REF is not activated, i.e., during the normal operation, the delay circuits 203 and 204 do not perform the delay operation, and pass through the inputted signals just as they are. In place of the refresh signal REF, or in addition to the refresh signal REF, a test signal TEST that is activated during a test operation can also be used.

Figure 4:
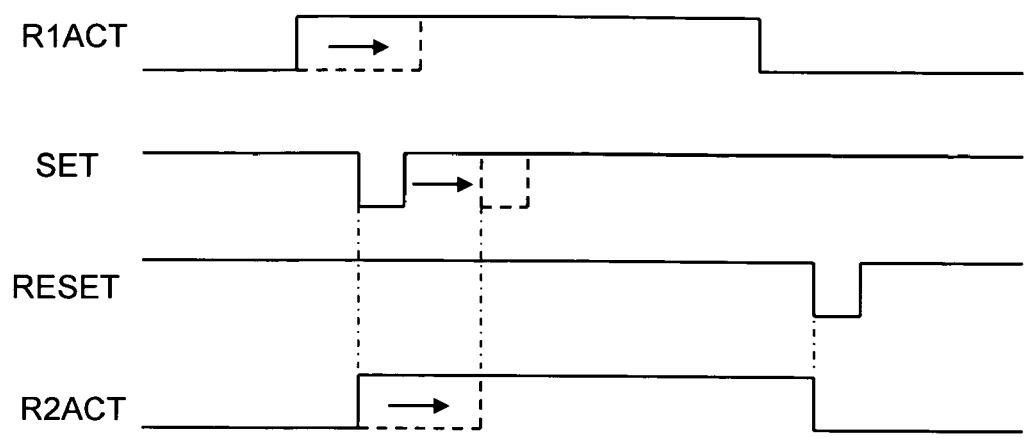
FIG. 4 is a signal waveform chart for explaining the operation of the clock control circuit.

FIG. 4 is a signal waveform chart for explaining the operation of a clock control circuit 200. In FIG. 4, a solid line indicates a waveform during the normal operation, and a broken line indicates a waveform during the refresh operation (or during the test operation).

As shown in FIG. 4, during both the normal operation and refresh operation, timing signals R1ACT and R2ACT are activated in this order. However, during the refresh operation, because of the delay caused by the delay circuits 203 and 204, the timing of activating the timing signals R1ACT and R2ACT is slower than that during the normal operation. However, with respect to a timing at which the timing signals R1ACT and R2ACT return to the non-activated state, there is no difference in timing.

Figure 5:
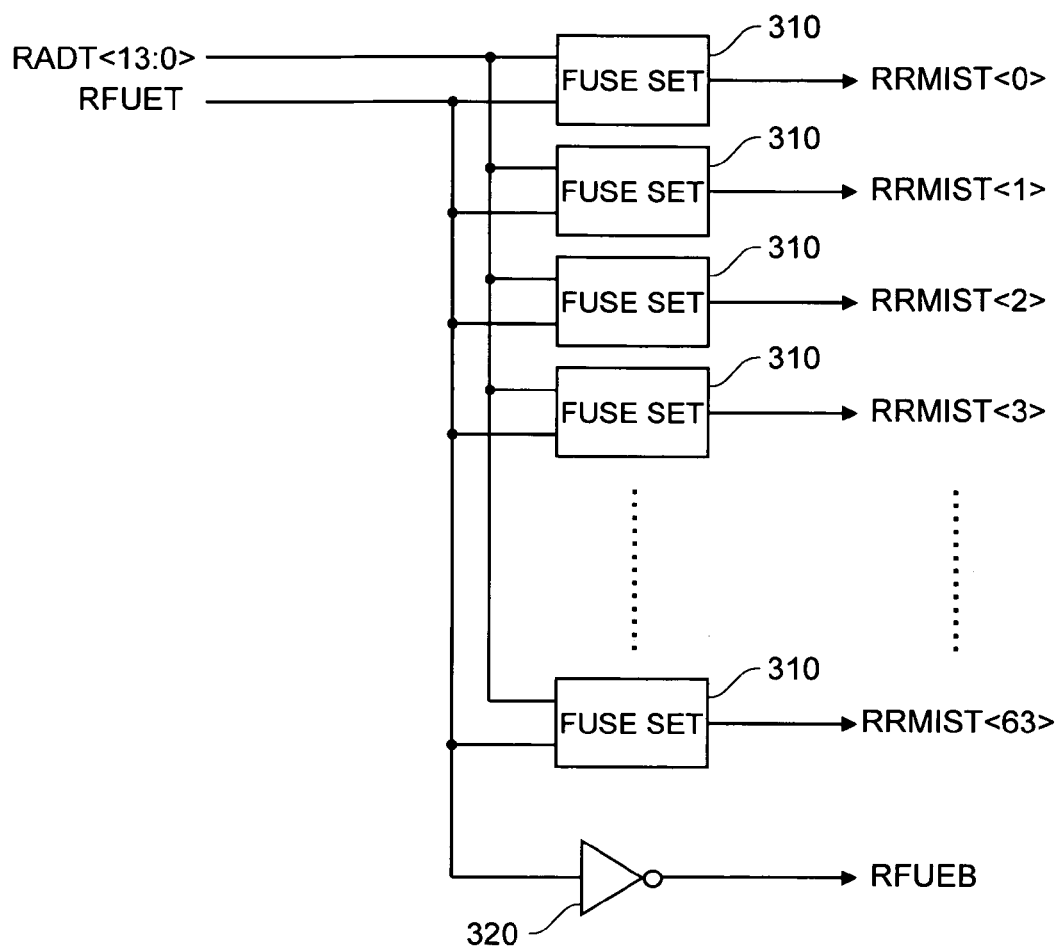
FIG. 5 is a circuit diagram of a repair determining circuit shown in FIG. 1.

FIG. 5 is a circuit diagram of the repair determining circuit 300.

As shown in FIG. 5, the repair determining circuit 300 includes a plurality (64 in this embodiment) of fuse sets 310. The fuse sets 310 each store therein a defective address, that is, an address of a normal memory cell to be replaced in a non-volatile manner. The types of devices that store therein with the address are not particularly limited. A fuse device cuttable by laser beam or a large current, and an anti-fuse device capable of transitioning from a non-conductive state to a conductive state by insulation breakdown may be included.

Each fuse set 310 is supplied with the row address RADT and the fuse enable signal RFUET, and in response to activation of the fuse enable signal RFUET, compares the supplied row address RADT with the stored defective address. When the both addresses do not match as a result of the comparison (in a case of mishit), a corresponding mishit signal RRMIST is activated to a high level. On the other hand, when the both addresses match (in a case of hit), the corresponding mishit signal RRMIST is set to a low level. The mishit signal RRMIST is supplied to the repair address decoder 400 shown in FIG. 1.

The fuse enable signal RFUET supplied to the repair determining circuit 300 is inverted by an inverter 320. The inverted fuse enable signal RFUEB is supplied to the repair address decoder 400.

Although the details are described later, in the semiconductor memory device according to the present embodiment, a memory cell array 700 is divided into a plurality of memory mats. The redundant memory cells accessed by the respective mishit signals PRMIST are allocated memory mats which are different from those corresponding to the defective addresses stored in the corresponding fuse sets 310 and which are not adjacent to the memory mats corresponding to the defective addresses. Accordingly, when either one of the mishit signals PRMIST is activated, an alternate access is attempted to a memory mat which is different from a memory mat that should be accessed by a supplied row address RADT and which is not adjacent.

As described later, the semiconductor memory device according to the present embodiment is of a so-called open-bit type, and selection-side bit lines and reference-side bit lines are allocated to memory mats different to each other. Accordingly, the "non-adjacent memory mat" in the present embodiment means a memory mat different from those which are adjacent over a sense amplifier. In other words, it means that a memory mat in which selection-side bit lines are allocated is different from that in which reference-side bit lines are allocated.

Such an allocation can be set during a wafer test performed at the production stage. During the wafer test, an operation test is performed for all the memory cells included in the memory cell array 700, and thereby, the address of the defective memory cells (defective address) is detected. The detected defective addresses are recorded in any fuse set 310. The relationship between each fuse set 310 and the repair-destination memory mat is fixed, and thus depending on the fuse set 310 in which the detected defective address is recorded, the relationship between the repair-source memory mat and the repair-destination memory mat is determined. Accordingly, by recording the detected defective address in a predetermined fuse set 310, it becomes possible to perform the allocation according to the rule. That is, the defective address of a memory mat different from the repair-destination memory mat and of a memory mat not adjacent to the repair-destination memory mat is stored in each fuse set 310.

The "memory mat" is the smallest division unit of the memory cell array 700, and the sub-word lines and bit lines are shared in the same memory mat. In the present embodiment, a word line is hierarchized into a main word line and a sub-word line, and the sub-word line becomes a gate electrode of a cell transistor.

Figure 6:
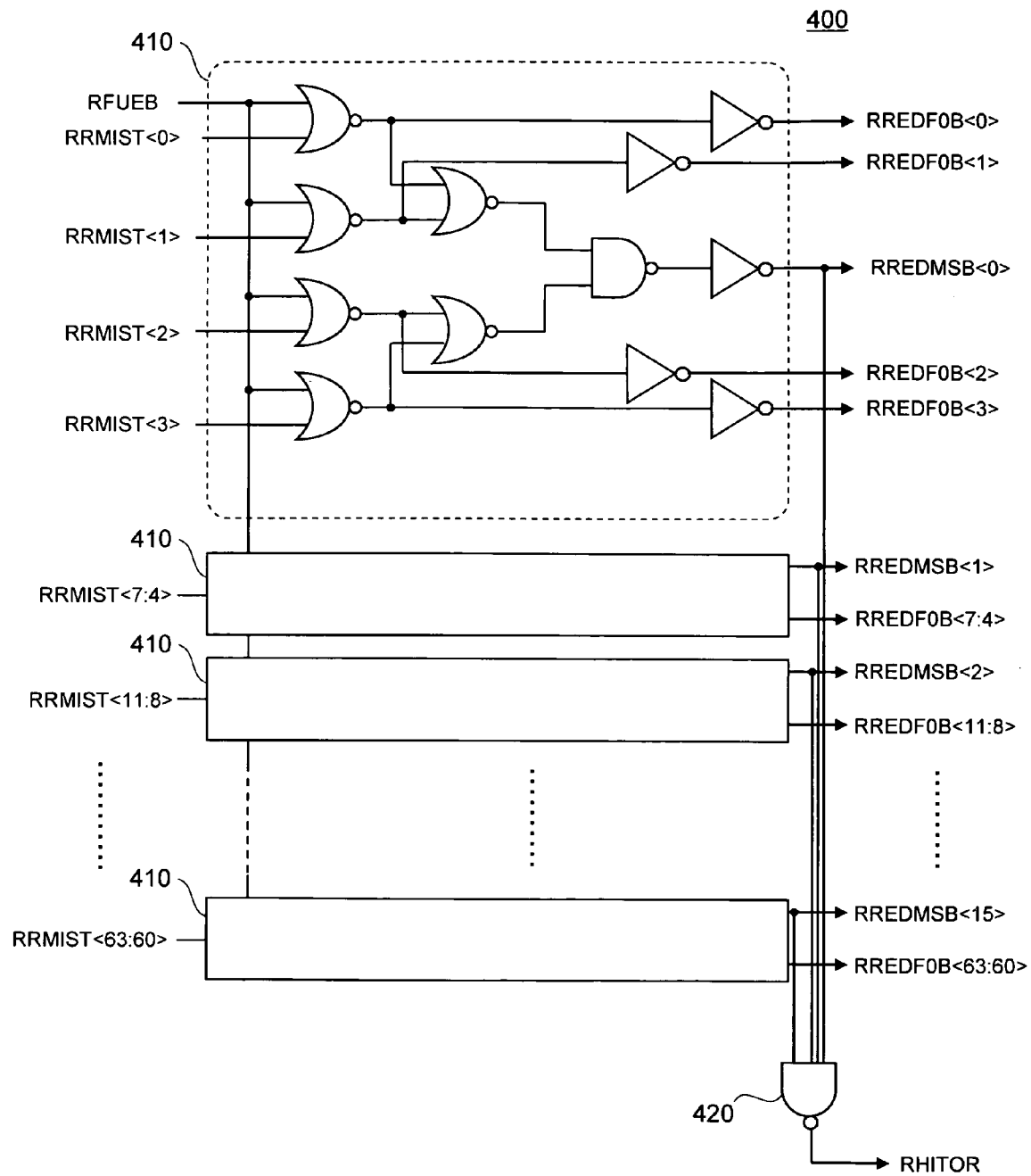
FIG. 6 is a circuit diagram of a repair address decoder shown in FIG. 1.

FIG. 6 is a circuit diagram of the repair address decoder 400.

As shown in FIG. 6, the repair address decoder 400 includes 16 control circuits 410 each of which receives the corresponding 4-bit misfit signal RRMIST, and a NAND circuit 420 that generates a hit signal RHITOR.

In response to the mishit signal RRMIST, each control circuit 410 generates corresponding 4-bit repair addresses RREDF0B and 1-bit repair address RREDMSB. Among these, each repair address RREDF0B (64 bits in all) is supplied to the array control circuit 600 shown in FIG. 1, and the repair address RREDMSB (16 bits in all) is supplied to the main word driver 500 and the array control circuit 600 shown in FIG. 1.

Further, the repair address RREDMSB is supplied also to the NAND circuit 420. The NAND circuit 420 is a circuit that activates the hit signal RHITOR to a high level when any one of the 16-bit repair addresses RREDMSB is activated. That is, the hit signal RHITOR is activated when any one of the fuse sets 310 included in the repair determining circuit 300 detects a match.

The hit signal RHITOR, together with the repair address RREDMSB, is supplied to the main word driver 500 and the array control circuit 600, and used as a cancel signal for canceling access to the normal memory cell. Therefore, the NAND circuit 420 generating the hit signal RHITOR constitutes a cancel-signal generating circuit of the present invention.

The main word driver 500 is explained next. In the main word driver 500, a plurality of two types of main word drivers MWDs and MWDRs are included, respectively.

Figure 7:
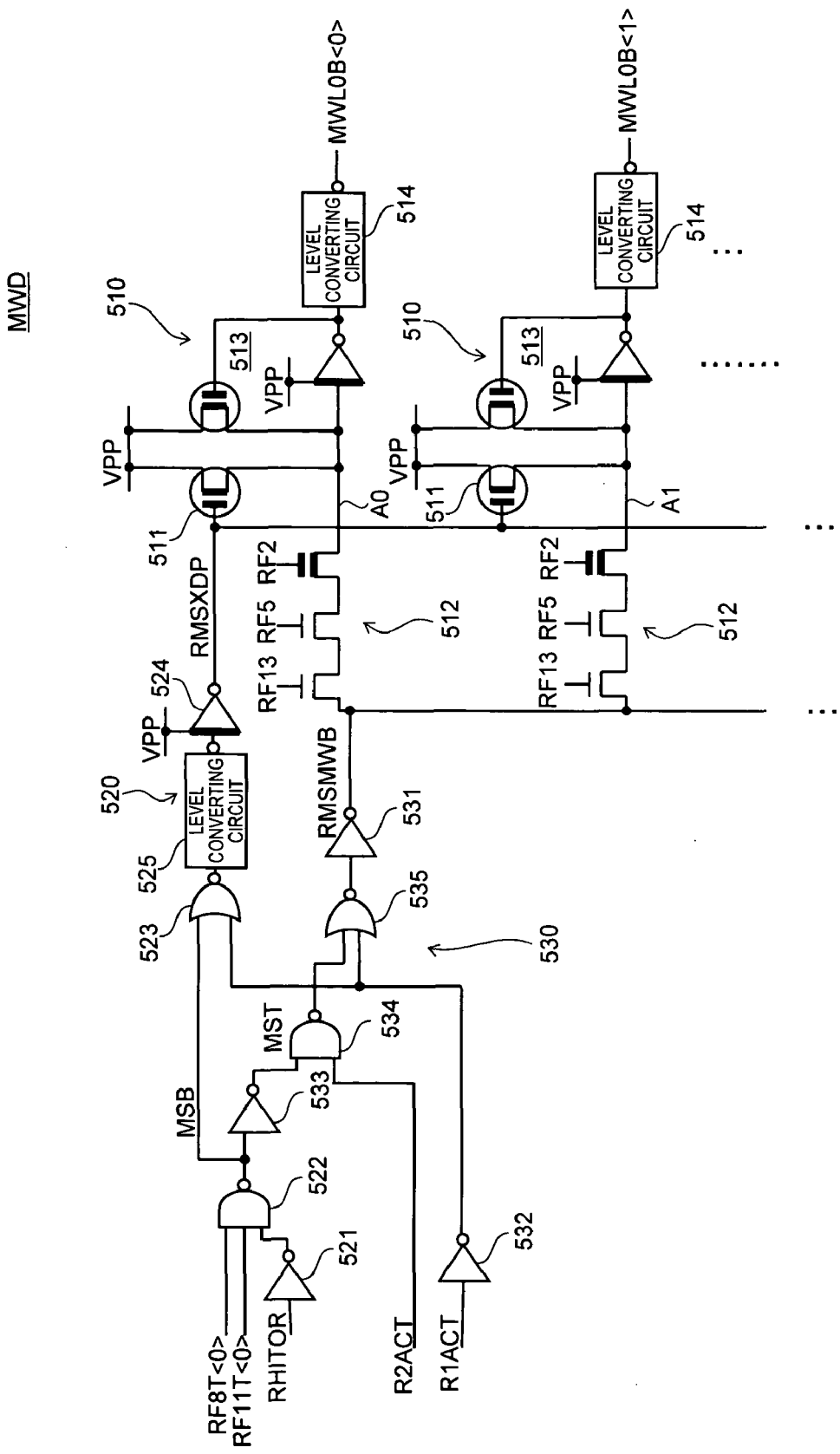
FIG. 7 is a circuit diagram of a main word driver MWD included in a main word driver shown in FIG. 1.

FIG. 7 is a circuit diagram of the main word driver MWD included in the main word driver 500.

The main word driver MWD is a circuit that accesses to the normal memory cell MC, and includes a plurality of driver circuits 510, a precharge control circuit 520 that determines precharge timings of nodes A0, A1, . . . , and a discharge control circuit 530 that determines discharge timings of the nodes A0, A1, . . . , as shown in FIG. 7.

The driver circuits 510 are circuits each driving the corresponding main word lines MWL0B<0>, <1>, based on levels of the nodes A0, A1, . . . , and is configured by a precharge transistor 511 connected between a power supply potential VPP and the nodes A0, A1, . . . , a discharge path 512 connected in series to the nodes A0, A1, . . . , a latch circuit 513 that maintains precharge states of the nodes A0, A1, . . . , and a level converting circuit 514 that level-converts output of the latch circuit 513.

A gate electrode of the precharge transistor 511 is supplied with an output signal RMSXDP of the precharge control circuit 520, and when the output signal RMSXDP becomes a low level, the nodes A0, A1, . . . are precharged to the power supply potential VPP. The discharge path 512 is constituted by three transistors connected in series to the nodes A0, A1, . . . , and gate electrodes thereof are supplied with one bit of the predecode signal RF2T, one bit of the predecode signal RF5T, and one bit of the predecode signal RF13T, respectively. The combination of the predecode signals RF2T, RF5T, and RF13T supplied to the discharge path 512 differs depending on each driver circuit 510, and when the bits corresponding to the predecode signals RF2T, RF5T, and RF13T are all at a high level, the discharge path 512 becomes conductive.

The level converting circuit 514 is a circuit that converts a potential on a low side from a VSS level (ground level) to a VKK level (<VSS). Accordingly, the main word lines MWL0B<0>, <1>, . . . driven by the main word driver MWD are transitioned between the VKK level and the VPP level.

On the other hand, the precharge control circuit 520 is configured by a plurality of logical circuits 521 to 524 and a level converting circuit 525. The logical circuits 521 to 524 controls the precharge transistor 511 based on one bit of the predecode signal RF8T, one bit of the predecode signal RF11T, the hit signal RHITOR, and the timing signal R1ACT. Among these, the logical circuits 521 to 523 are operated by a normal power supply (VDD), while the logical circuit 524 is operated by a boosted power supply VPP. Accordingly, the level converting circuit 525 converts the signal level between the logical circuits 523 and 524.

The combination of the predecode signals RF8T and RF11T supplied to the precharge control circuit 520 differs depending on each main word driver MWD, and when both of the bits corresponding to the predecode signals RF8T and RF11T are at a high level, the precharge of the nodes A0, A1, . . . is stopped in response to the activation of the timing signal R1ACT. When the hit signal RHITOR is activated, the precharge operation is resumed irrespective of the predecode signals RF8T and RF11T.

The discharge control circuit 530 is configured by an inverter 531 connected to the discharge path 512 and a plurality of logical circuits 532 to 535 that control the inverter 531. The discharge control circuit 530 is supplied with timing signals R1ACT and R2ACT, and when both of the bits corresponding to the predecode signals RF8T and RF11T are at a high level, sets output of the inverter 531 to a low level and permits the discharge of the nodes A0, A1, . . . in response to the activation of the timing signal R2ACT. However, when the hit signal RHITOR is activated, the output of the inverter 531 is at a high level irrespective of the predecode signals RF8T and RF11T, and the discharge of the nodes A0, A1, . . . is prohibited.

By such a circuit configuration, the main word driver MWD can activate the predetermined main word lines MWL0B<0>, <1>, . . . , corresponding to the row address RADT. When the hit signal RHITOR is activated by the detection of the defective address, it becomes possible to stop the selection operation of the main word lines MWL0B<0>, <1>, . . . to reset all the main word lines MWL0B<0>, <1>, . . . , to an inactivated state. In other words, at a stage before the level of the hit signal RHITOR is finalized, the driver circuit 510 activates the main word lines MWL0B<0>, <1>, . . . , irrespective of whether the row address RADT is a defective address.

As described above, in the main word driver 500, such a main word driver MWD is provided in plural.

Figure 8:
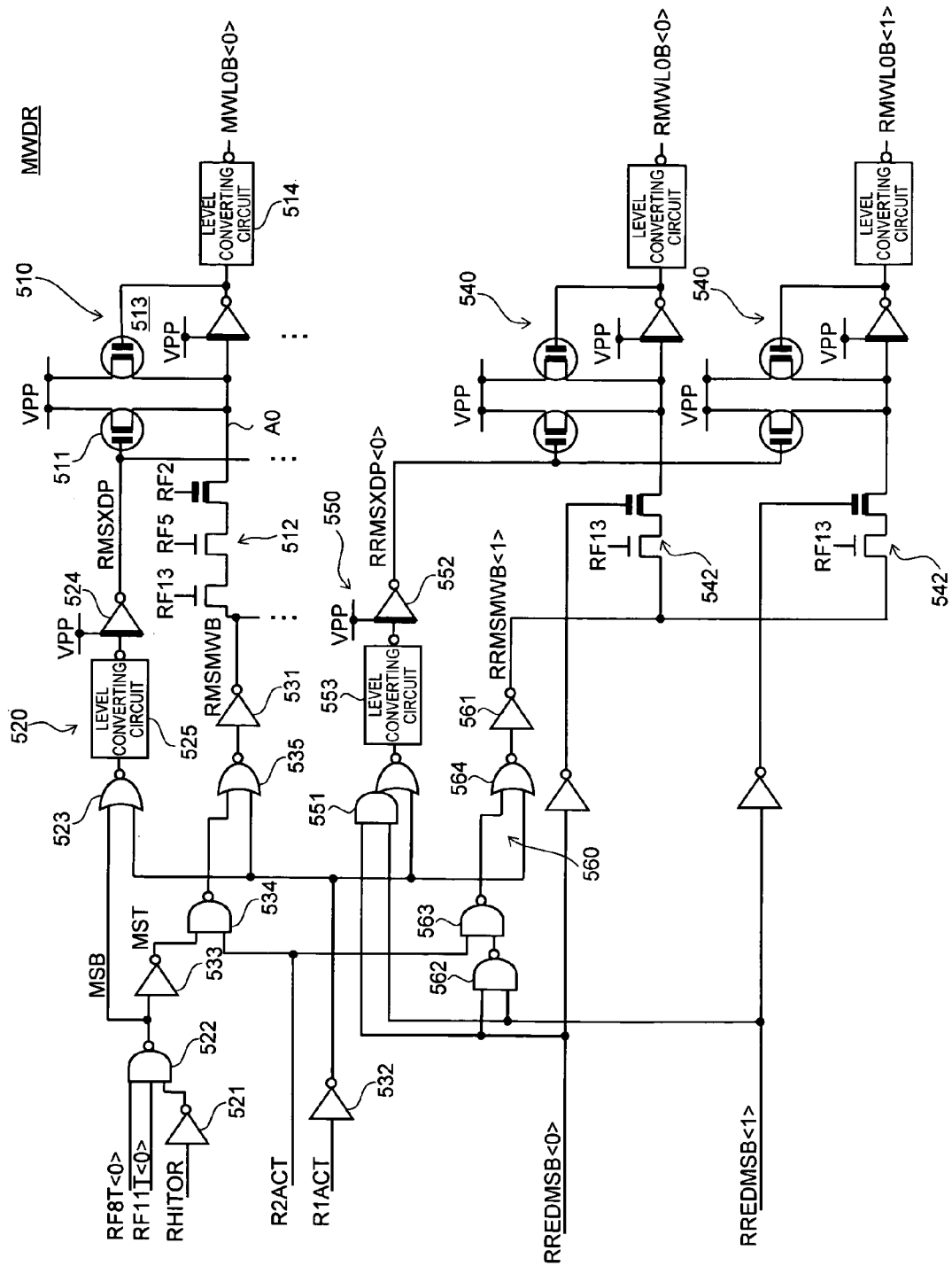
FIG. 8 is a circuit diagram of a main word driver MWDR included in the main word driver.

FIG. 8 is a circuit diagram of the main word driver MWDR included in the main word driver 500.

The main word driver MWDR is a circuit that accesses the normal memory cell MC or the redundant memory cell RMC, and has a configuration in which two driver circuits 540, a precharge control circuit 550 that determines precharge timings of the nodes B0 and B1, and a discharge control circuit 560 that determines discharge timings of the nodes B0 and B1 are added, as shown in FIG. 8. The rest of the configuration is the same as that of the main word driver MWD shown in FIG. 7, and thus the same parts are designated by the same reference numerals and redundant explanations will be omitted.

The driver circuit 540 is a circuit that drives the corresponding redundant main-word lines RWML0B<0> and <1> based on levels of the nodes B0 and B1, respectively. The driver circuit 540 has a circuit configuration similar to that of the driver circuit 510 shown in FIG. 7 except that a discharge path 542 is configured by two transistors. To one of the transistors configuring the discharge path 542, an inverted signal of the repair address RREDMSB, which is output of the repair address decoder 400, is supplied.

The precharge control circuit 550 is configured by a plurality of logical circuits 551 and 552, and a level converting circuit 553. The logical circuits 551 and 552 control the precharge transistor 541 based on the repair address RREDMSB and the timing signal R1ACT. The repair address RREDMSB is a low-active signal, and is at a high level at a normal time. When any one of the repair addresses RREDMSB is changed to a low level by the detection of the defective address, the precharges of the nodes B0 and B1 are stopped in response to the activation of the timing signal R1ACT.

The discharge control circuit 560 is configured by an inverter 561 connected to the discharge path 542 and a plurality of logical circuits 562 to 564 that control the inverter 561. The discharge control circuit 560 is supplied with the timing signals R1ACT and R2ACT and the repair address RREDMSB, and when any one of the repair addresses RREDMSB is at a low level, sets the output of the inverter 561 to a low level in response to the activation of the timing signal R2ACT to permit the discharge of the nodes B0 and B1.

By such a circuit configuration, in addition to the function of the main word driver MWD shown in FIG. 7, the main word driver MWDR becomes to be imparted with a function of activating the predetermined redundant main-word lines RMWL0B<0> and <1> when a defective address is detected. Thus, when the row address RADT is a defective address, the driver circuit 540 activates the redundant main-word lines RMWL0B<0> and <1>.

As described above, in the main word driver 500, such a main word driver MWDR is provided in plural.

The array control circuit 600 is explained next. In the array control circuit 600, two types of control circuits ARAC and ARACR are each included in plural.

Figure 9:
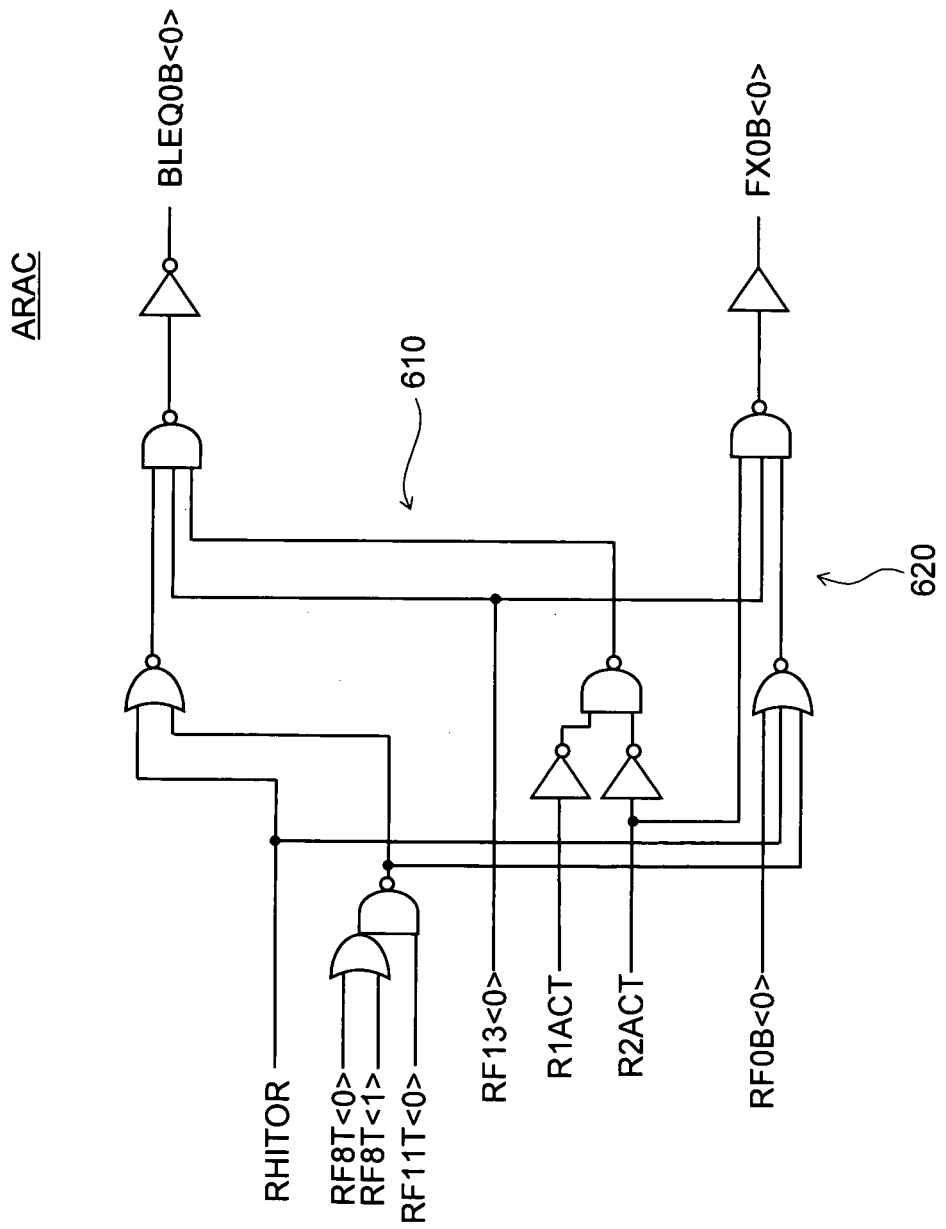
FIG. 9 is a circuit diagram of a control circuit ARAC included in an array control circuit shown in FIG. 1.

FIG. 9 is a circuit diagram of a control circuit ARAC included in the array control circuit 600.

As shown in FIG. 9, the control circuit ARAC is configured by an equalize control circuit 610 that generates an equalize signal BLEQ0B and a sub-word control circuit 620 that generates a sub-word line selection signal FX0B. The equalize control circuit 610 and the sub-word control circuit 620 are both configured by a plurality of logical circuits.

The equalize control circuit 610 generates the equalize signal BLEQ0B based on two bits of the predecode signal RF8T, one bit of the predecode signal RF11T, one bit of the predecode signal RF13T, the hit signal RHITOR, and the timing signals R1ACT and R2ACT. The combination of the predecode signals RF8T, RF11T, and RF13T supplied to the equalize control circuit 610 differs depending on each control circuit ARAC, and when the signals match a predetermined combination, the equalize signal BLEQ0B is inactivated to a high level. When the hit signal RHITOR is activated, the equalize signal BLEQ0B is at a low level (active) irrespective of the predecode signals RF8T, RF11T, and RF13T.

The sub-word control circuit 620 generates a sub-word line selection signal FX0B based on one bit of the predecode signal RF0B, two bits of the predecode signal RF8T, one bit of the predecode signal RF11T, one bit of the predecode signal RF13T, the hit signal RHITOR, and the timing signal R2ACT. The combination of the predecode signals RF0B, RF8T, RF11T, and RF13T supplied to the sub-word control circuit 620 also differs depending on each control circuit ARAC, and when the predecode signals match a predetermined combination, the sub-word-line selection signal FX0B is activated to a low level. When the hit signal RHITOR is activated, the sub-word line selection signal FX0B is at a high level (inactive) irrespective of the predecode signals RF0B, RF8T, RF11T, and RF13T.

Figure 10:
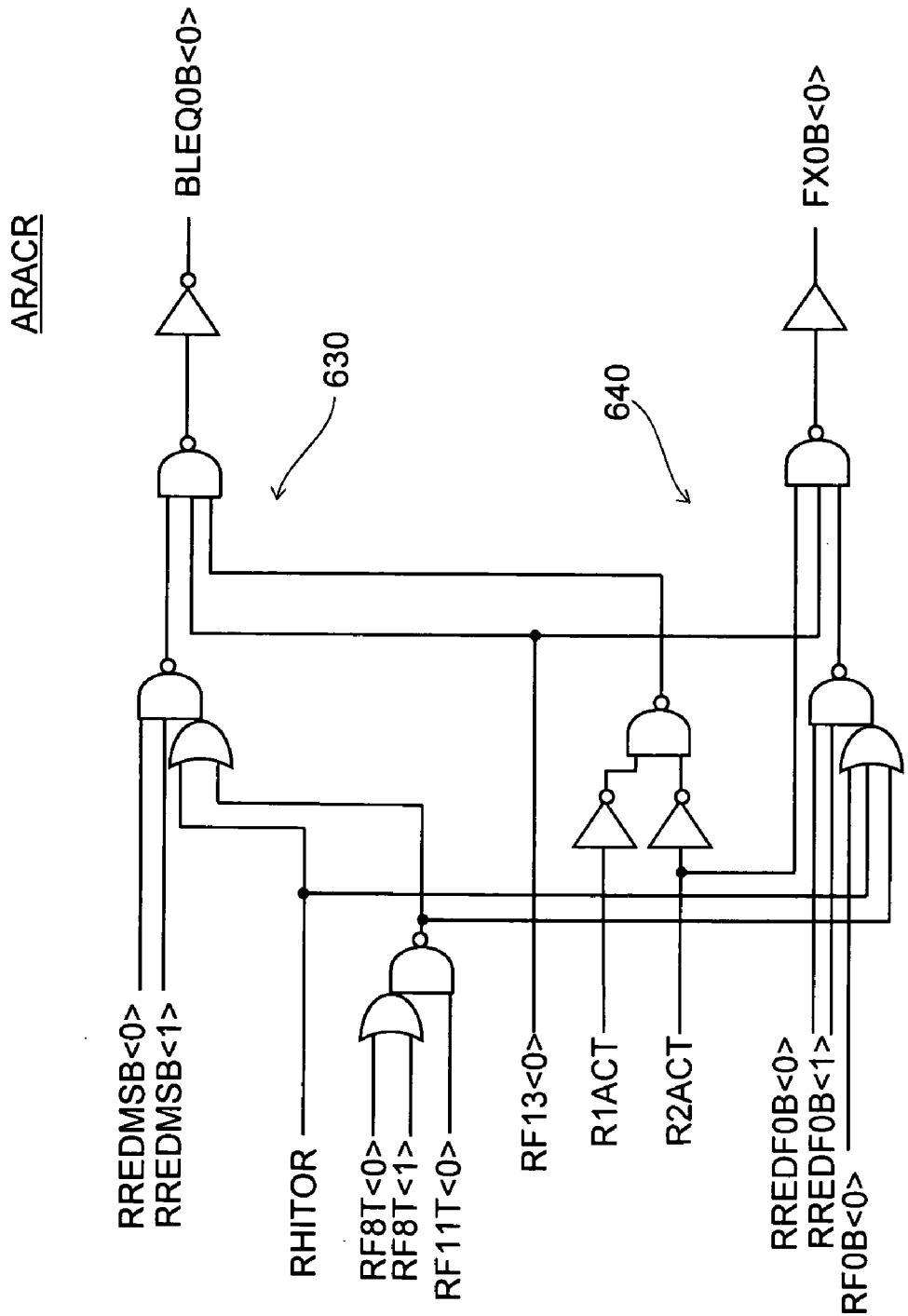
FIG. 10 is a circuit diagram of a control circuit ARACR included in the array control circuit.

FIG. 10 is a circuit diagram of a control circuit ARACR included in the array control circuit 600.

As shown in FIG. 10, the control circuit ARACR is configured by an equalize control circuit 630 that generates an equalize signal BLEQ0B and a sub-word control circuit 640 that generates a sub-word line selection signal FX0B. The equalize control circuit 630 and the sub-word control circuit 640 are both configured by a plurality of logical circuits.

The equalize control circuit 630 is similar to the equalize control circuit 610 shown in FIG. 9, however, differs in that it generates the equalize signal BLEQ0B additionally based on the repair address RREDMSB. By the circuit configuration shown in FIG. 10, the equalize control circuit 630 inactivates the equalize signal BLEQ0B to a high level not only when the predecode signals RF8T, RF11T, and RF13T match a predetermined combination but also when the repair address RREDMSB is activated.

The sub-word control circuit 640 is also similar to the sub-word control circuit 620 shown in FIG. 9, however, differs in that it generates the sub-word line selection signal FX0B additionally based on the repair address RREDF0B. By the circuit configuration shown in FIG. 10, the sub-word control circuit 640 activates the sub-word line selection signal FX0B to a low level not only when the predecode signals RF0B, RF8T, RF11T, and RF13T match a predetermined combination, but also when the repair address RREDF0B is activated.

Various signals generated by the main word driver 500 and the array control circuit 600 are supplied to the memory cell array 700 shown in FIG. 1. In the memory cell array 700, a plurality of sub-word drivers SWD and SWDR that drive the sub-word line SWL and the redundant sub-word line RSWL, respectively, and a plurality of sense amplifiers SA connected to the bit line BL are arranged. At a crosspoint between the sub-word line SWL and the bit line BL, the normal memory cell MC is arranged, and at a crosspoint between the redundant sub-word line RSWL and the bit line BL, the redundant memory cell RMC is arranged. Although not shown, in the actual memory cell array 700, the redundant bit line or the like are also arranged.

Figure 11:
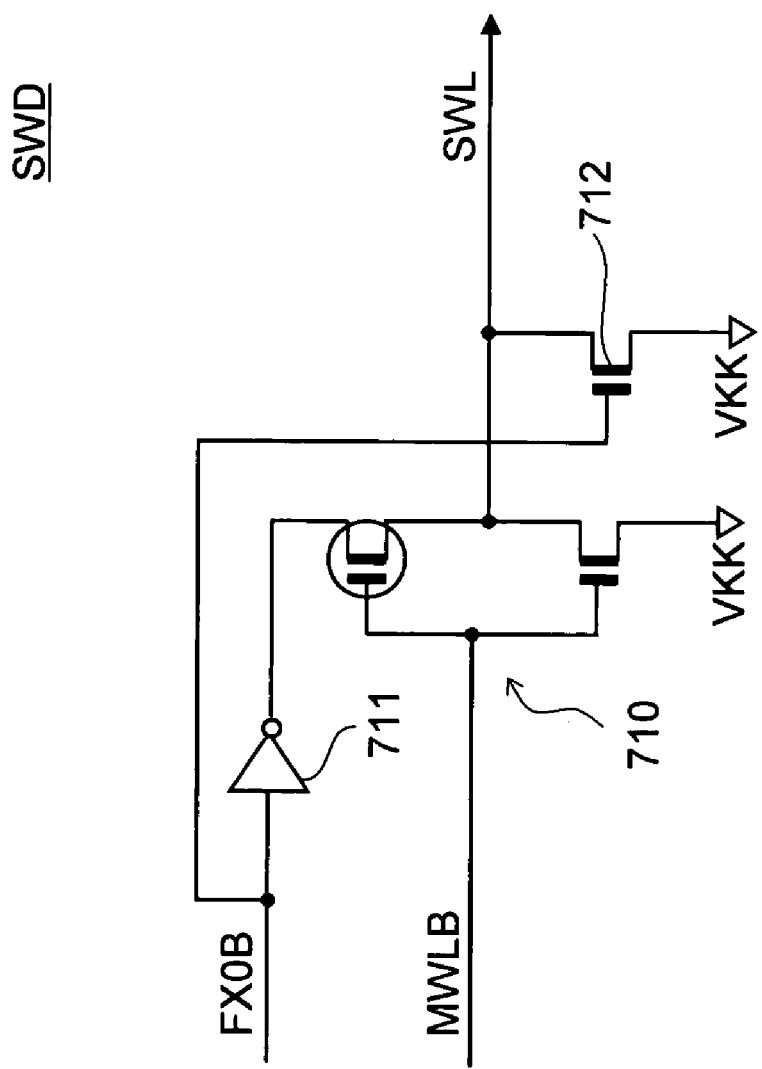
FIG. 11 is a circuit diagram of a sub-word driver SWD included in a memory cell array shown in FIG. 1.

FIG. 11 is a circuit diagram of the sub-word driver SWD.

As shown in FIG. 11, the sub-word driver SWD is configured by an inverter 710 that inverts the level of the main word line MWL0B, an inverter 711 that supplies voltage to the inverter 710 based on the sub-word line selection signal FX0B, and a reset transistor 712 that resets the sub-word line SWL based on the sub-word line selection signal FX0B. By such a configuration, both the main word line MWL0B and the sub-word line selection signal FX0B are activated to a low level, the corresponding sub-word line SWL is driven to a high level. In other cases, the corresponding sub-word line SWL is fixed to a low level.

Figure 12:
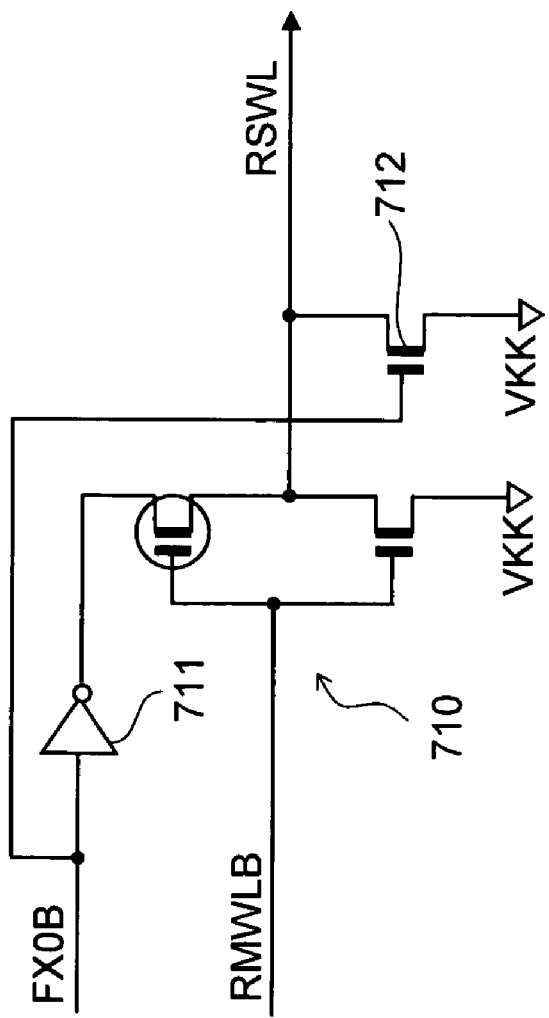
FIG. 12 is a circuit diagram of a sub-word driver SWDR included in the memory cell array.

FIG. 12 is a circuit diagram of the sub-word driver SWDR.

As shown in FIG. 12, the sub-word driver SWDR has the same circuit configuration as that of the sub-word driver SWD shown in FIG. 11 except that a redundant main-word line RMWL0B and a redundant sub-word line RSWL are used instead of the main word line MWL0B and the sub-word line SWL.

Figure 13:
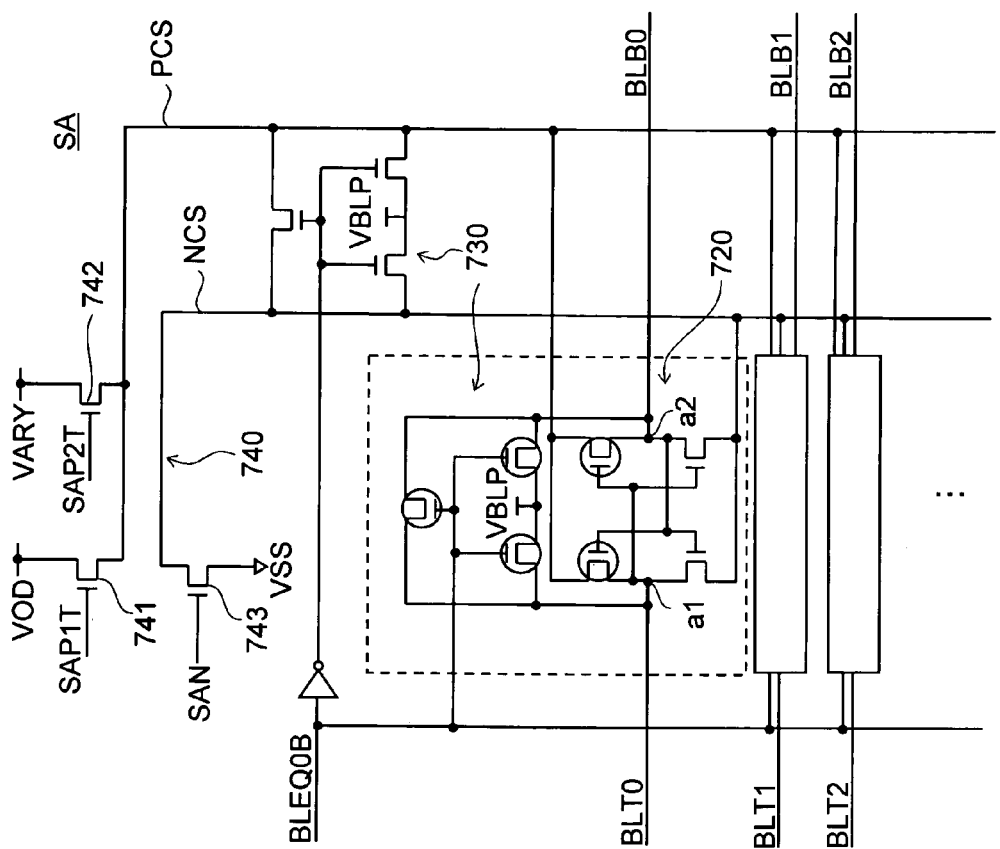
FIG. 13 is a circuit diagram of a sense amplifier SA included in the memory cell array.

FIG. 13 is a circuit diagram of the sense amplifier SA.

As shown in FIG. 13, the sense amplifier SA includes a sense circuit unit 720 connected to bit-line pairs BLT and BLB, an equalize circuit 730 that equalizes the sense circuit unit 720, and a driver circuit 740 that drives the sense circuit unit 720, and serves a role for amplifying data of the accessed normal memory cell MC or redundant memory cell RMC.

The sense circuit unit 720 is a cross-coupled flip-flop circuit of which the one input/output node a1 is connected to a bit line BLT and of which the other input/output node a2 is connected to a bit line BLB. The equalize circuit 730 is a circuit that is activated in response to the equalize signal BLEQ0B. When the equalize signal BLEQ0B is at a low level, the equalize circuit 730 equalizes the input/output nodes a1 and a2 of the sense circuit unit 720 to the same potential VBLP. At this time, wirings PCS and NCS that supply an operation voltage to the sense circuit unit 720 are also equalized to the same potential.

The driver circuit 740 is a circuit that supplies an operation voltage to the sense circuit unit 720 via the wirings PCS and NCS, and is configured by transistors 741 and 742 connected to the wiring PCS and a transistor 743 connected to the wiring NCS.

The transistor 741 is a transistor that supplies an overdrive potential VOD (>VARY) to the wiring PCS in response to the timing signal SAP1T, and is turned on in an initial stage of a sense operation. The transistor 742 is a transistor that supplies an array potential VARY (high-side potential of the memory cell) to the wiring PCS in response to the timing signal SAP2T, and is turned on after the end of the overdrive by the transistor 741. The transistor 743 is a transistor that supplies a ground potential VSS (low-side potential of the memory cell) to the wiring NCS in response to the timing signal SAN, and is turned on all the time during the sense operation. As described above, the timing signals SAP1T, SAP2T, and SAN configure the sense-amplifier operation signal SAT shown in FIG. 1 and FIG. 3.

When the equalize circuit 730 is in an inactivated state and the driver circuit 740 is in an activated state by such a circuit configuration, data reading and writing to and from the memory cells MC and RMC via the bit-line pairs BLT and BLB become possible.

Figure 14:
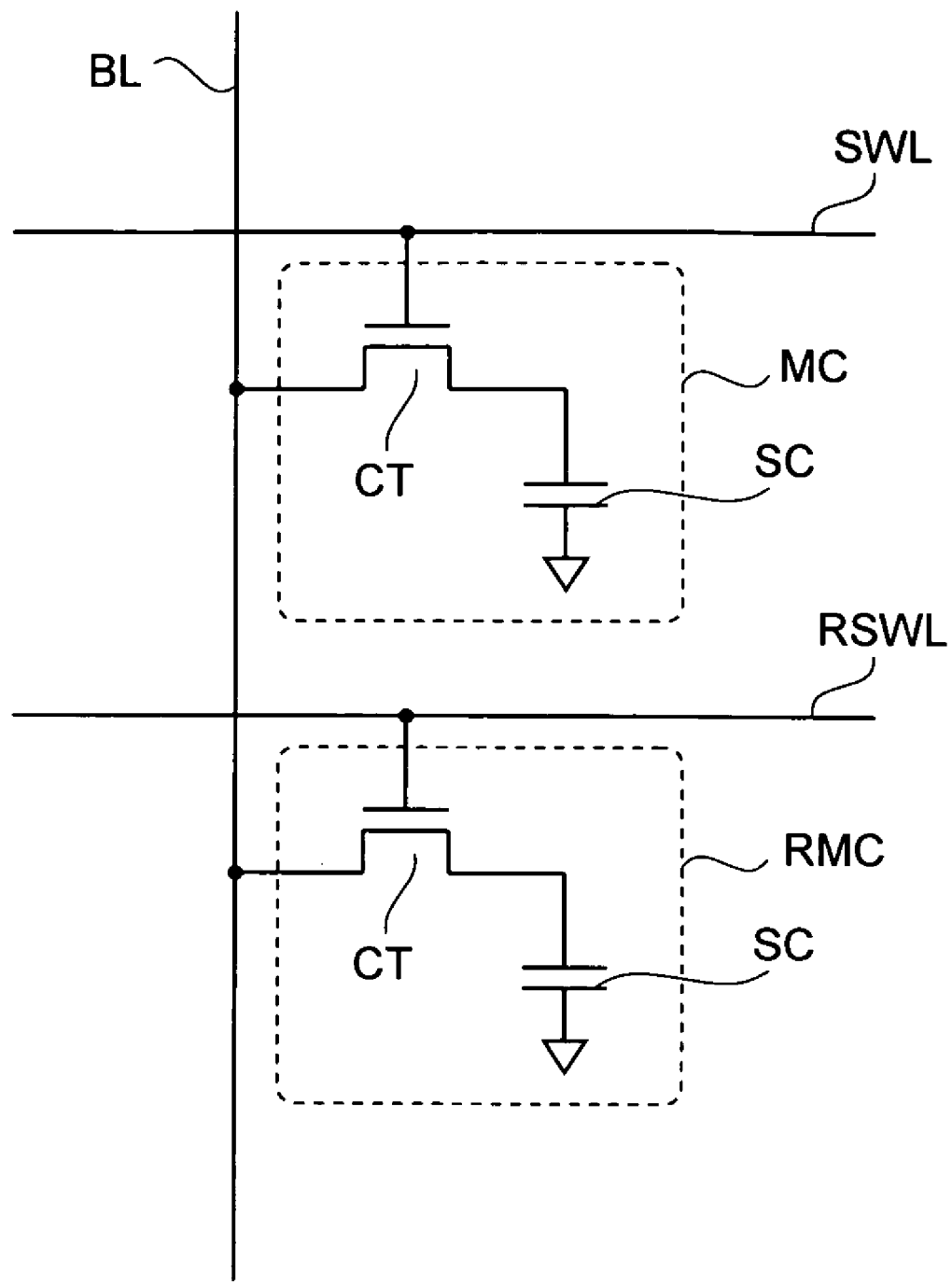
FIG. 14 is a circuit diagram of a normal memory cell MC and the redundant memory cell RMC included in the memory cell array.

FIG. 14 is a circuit diagram of the normal memory cell MC and the redundant memory cell RMC.

As shown in FIG. 14, the normal memory cell MC and the redundant memory cell RMC have the same circuit configuration, and both are configured by a cell transistor CT and a storage capacitor SC connected in series to the bit line BL (BLT or BLB). In the normal memory cell MC, a gate electrode of the cell transistor CT is connected to the sub-word line SWL, and in the redundant memory cell RMC, a gate electrode of the cell transistor CT is connected to the redundant sub-word line RSWL. By such a configuration, when the sub-word line SWL or the redundant sub-word line RSWL is activated, the corresponding cell transistor CT is turned on, and the storage capacitor SC is connected to the bit line BL. Thereby, it becomes possible to transmit and receive charge via the bit line BL.

Thus, the circuit configuration of the semiconductor memory device is described. By such a circuit configuration, at a stage before the level of the hit signal RHITOR is finalized, the sub-word driver SWD can execute an access operation to the normal memory cell irrespective of whether the row address RADT is a defective address. When the row address RADT is a defective address, the sub-word driver SWDR can execute an access operation to the redundant memory cell.

A preferred layout on the chips of the semiconductor memory device is described next.

Figure 15:
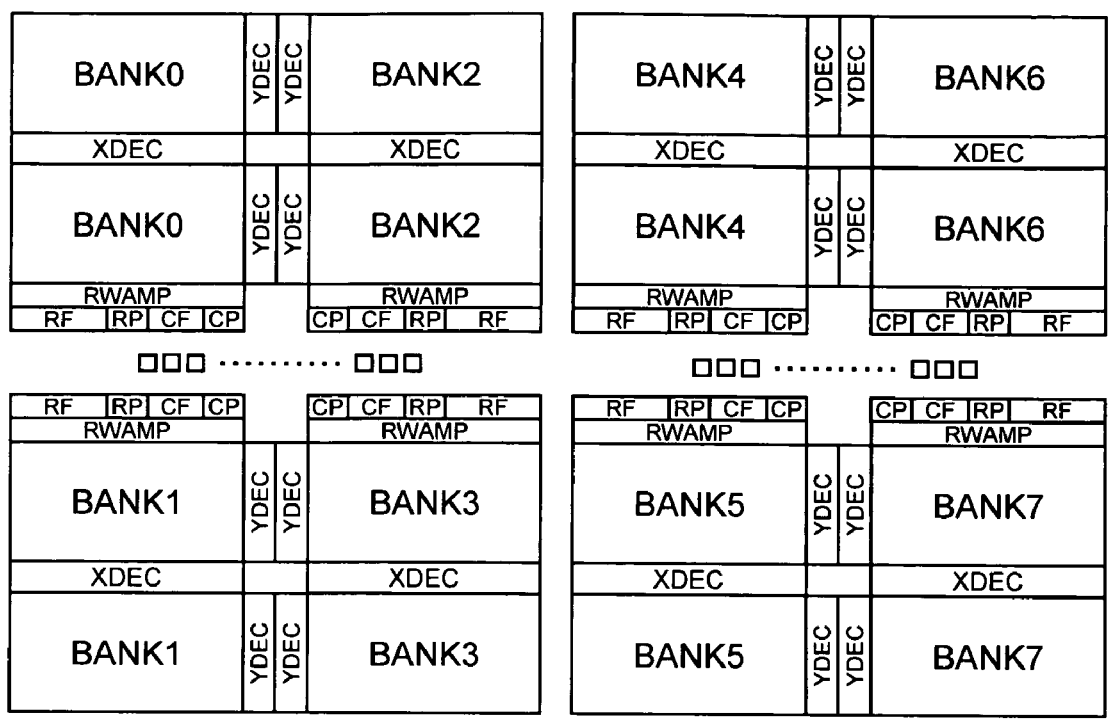
FIG. 15 is a schematic plan view for explaining an example of a preferred layout on the chips of the semiconductor memory device.

FIG. 15 is a schematic plan view for explaining an example of the preferred layout on the chips of the semiconductor memory device.

As shown in FIG. 15, in this example, the memory cell array 700 is divided into eight banks from BANK0 to BANK7. A row main decoder XDEC, a column decoder YDEC, a read-write amplifier RWAMP, a repair determining circuit RF, a row predecoder RP, a column fuse CF, and a column predecoder CP are allocated to each bank, respectively.

Among these, the row main decoder XDEC is a circuit block including the main word driver 500 and the array control circuit 600 shown in FIG. 1. The repair determining circuit RF shown in FIG. 15 is a circuit block including not only the repair determining circuit 300 but also the repair address decoder 400 shown in FIG. 1. Further, the row predecoder RP is a circuit block including the row predecoder 100 and the clock control circuit 200 shown in FIG. 1. A plurality of external terminals including the address terminal 10 and the command terminal 20 shown in FIG. 1 are arranged in a region between the even-numbered banks BANK0, BANK2, BANK4, and BANK6, and odd-numbered banks BANK1, BANK3, BANK5, and BANK7.

As shown in FIG. 15, all of the row main decoder XDEC, the row predecoder RP, and the repair determining circuit RF have a shape in which the column direction is set to be a longitudinal direction. Therefore, the row predecoder RP and the repair determining circuit RF are arranged adjacent to each other in the column direction, and are arranged parallel to the row main decoder XDEC. The read-write amplifier RWAMP also has a shape in which the column direction is set to be a longitudinal direction, and is arranged parallel to the row main decoder XDEC.

Figure 16:
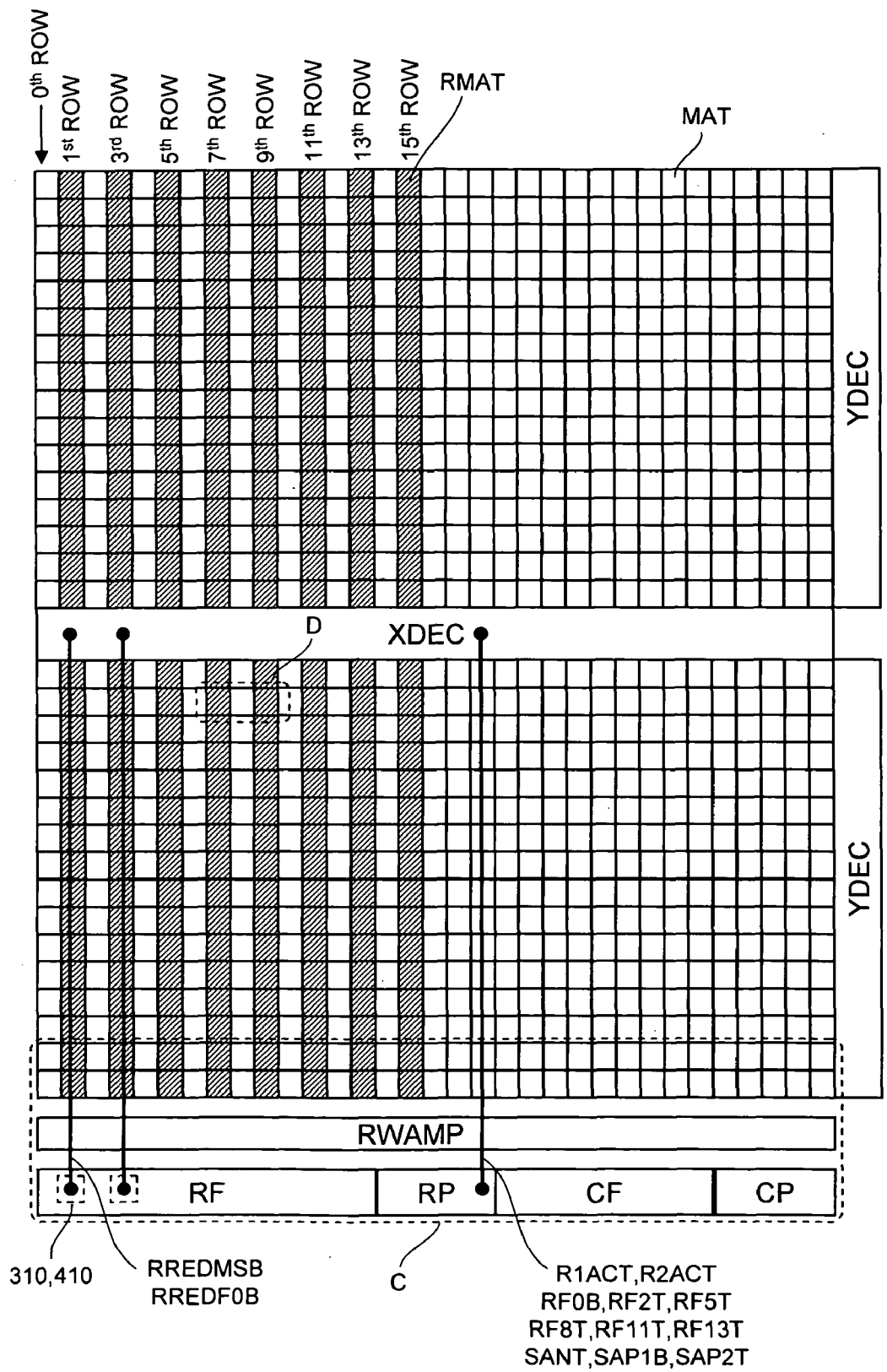
FIG. 16 is a schematic diagram for explaining an example of a memory mat configuration in each bank.

FIG. 16 is a schematic diagram for explaining an example of the memory mat configuration in each bank.

As shown in FIG. 16, in the present embodiment, each bank is divided into two by the row main decoder XDEC, and each part is configured by memory mats MAT or RMAT of 33 rows×16 columns. Among the memory mats shown in FIG. 16, those shown as shaded are the memory mats RMAT (redundant memory mats) that include the redundant sub-word lines RSWL, and the other are the memory mats MAT (normal memory mats) that do not include the redundant sub-word lines RSWL.

In the present embodiment, 256 sub-word lines SWL and 512 bit lines BL are allocated to one memory mat MAT, and normal memory cells MC are arranged at their cross points. In contrast, eight redundant sub-word lines RSWL are added to the memory mat RMAT, and the redundant memory cells RMC are arranged at the cross points of the redundant sub-word lines RSWL and bit lines BL.

While column redundant circuits such as redundant bit lines are also included in practice, explanations thereof will be omitted.

When it is assumed that the leftmost row shown in FIG. 16 as a row number 0, the memory mats RMAT that include the redundant sub-word lines RSWL are to be arranged in the first, third, fifth, seventh, ninth, eleventh, thirteenth, and fifteenth rows. The Memory mats RMAT arranged in the same rows are those that are selected by the same redundant main word line RMWL0B. As shown in FIG. 16, the repair determining circuit RF is arranged in the lower part of the rows in which the memory mats RMAT are arranged, and each fuse set 310 (see FIG. 5) and the control circuit 410 (see FIG. 6) included in the repair determining circuit RF are arranged in the corresponding row or in its vicinity. Thereby, redundant signals RREDMSB and RREDF0B can be arranged almost linearly, without having to route their wiring.

As described above, the reason for the uneven distribution of the memory mats RMAT in a part of the area of the memory cell array (the left-side area in FIG. 16) is to attempt to substantially match the positions in the column direction of each row in which memory mats RMAT are arranged and the corresponding fuse sets 310. As shown in FIG. 16, the reason for arranging memory mats RMAT in alternate rows is because the area occupied by fuse sets 310 on the chips is comparatively large, and by arranging the memory mats RMAT in alternate rows, the corresponding positions of the memory mats RMAT and the fuse set 310 can be substantially aligned. Accordingly, when the size of fuse sets 310 is relatively large, the memory mats RMAT can even be, for example, arranged in every third row, and conversely, when the size of the fuse sets 310 is relatively small, the memory mats RMAT can even be arranged continuously. When selecting the repair-destination memory mats, it is necessary to select memory mats which are different from the repair-source memory mats and which are not adjacent to the repair-source memory mats. Thus, by arranging the memory mats RMAT in alternate rows, the repair efficiency can be also increased.

The row predecoder RP is arranged adjacent to the repair determining circuit RF. This is because in the semiconductor memory device, the determining operation by the repair determining circuit and the access operation to the normal memory cells MC by the row predecoder RP are performed in parallel, as described later, and thus it is desired that the distance from the row predecoder RP to the row main decoder XDEC and the distance from the repair determining circuit RF to the row main decoder XDEC are as equal as possible.

That is, in a general semiconductor memory device, the determining operation by the repair determining circuit is performed first, and it is only after this operation is completed that the decode operation by the row predecoder is performed. Thus, it is desired that the repair determining circuit be arranged near the address latch circuit, while the row predecoder be arranged near the row main decoder. However, when such an arrangement is adopted in the present embodiment, the distance from the repair determining circuit RF to the row main decoder XDEC becomes considerably long as compared to the distance from the row predecoder RP to the row main decoder XDEC, and the effect of the high-speed access by the parallel operation is reduced.

In contrast, in the present embodiment, according to the layout shown in FIG. 16, the distance from the row predecoder RP to the row main decoder XDEC, and the distance from the repair determining circuit RF to the row main decoder XDEC are substantially the same, and thus it becomes possible to effectively execute high-speed access by the parallel operation.

As shown in FIG. 16, the column fuse CF and the column predecoder CP are arranged in parallel next to the row predecoder RP. The read-write amplifier RWAMP is arranged between the repair determining circuit RF, the row predecoder RP, the column fuse CF, and the column predecoder CP and the memory mats MAT and RMAT.

Figure 17:
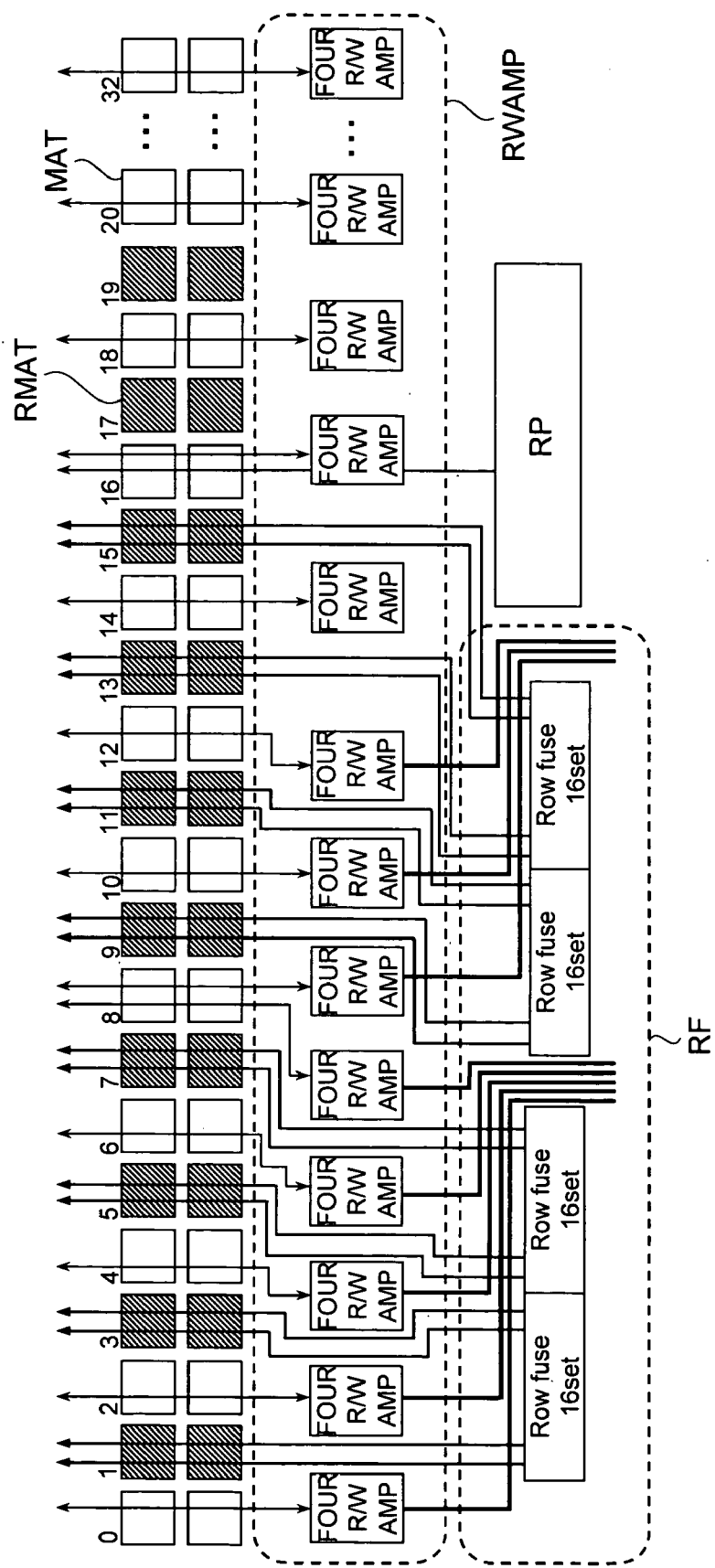
FIG. 17 is an enlarged view showing the details of the main parts of a region C shown in FIG. 16.

FIG. 17 is an enlarged view showing the details of the main parts of a region C shown in FIG. 16.

As shown in FIG. 17, signal wirings of two redundant signals RREDMSB and eight redundant signals RREDF0B (total 10) are arranged on each row in which the memory mats RMAT are arranged. There are eight rows in which the memory mats RMAT are arranged, and thus the number of these redundant signals is 80 in all. On the other hand, eight main I/O lines MIO connected to the read-write amplifiers RWAMP are arranged on the memory mats MAT each arranged on the even-numbered rows, respectively. Apart from these, approximately 40 signal wires are arranged from the row predecoders RP to the row main decoders XDEC. Thus, when the wirings of redundant signals RREDMSB and RREDF0B are arranged on the corresponding memory mats RMAT, the wiring length can be shortened to the minimum limit.

Figure 18:
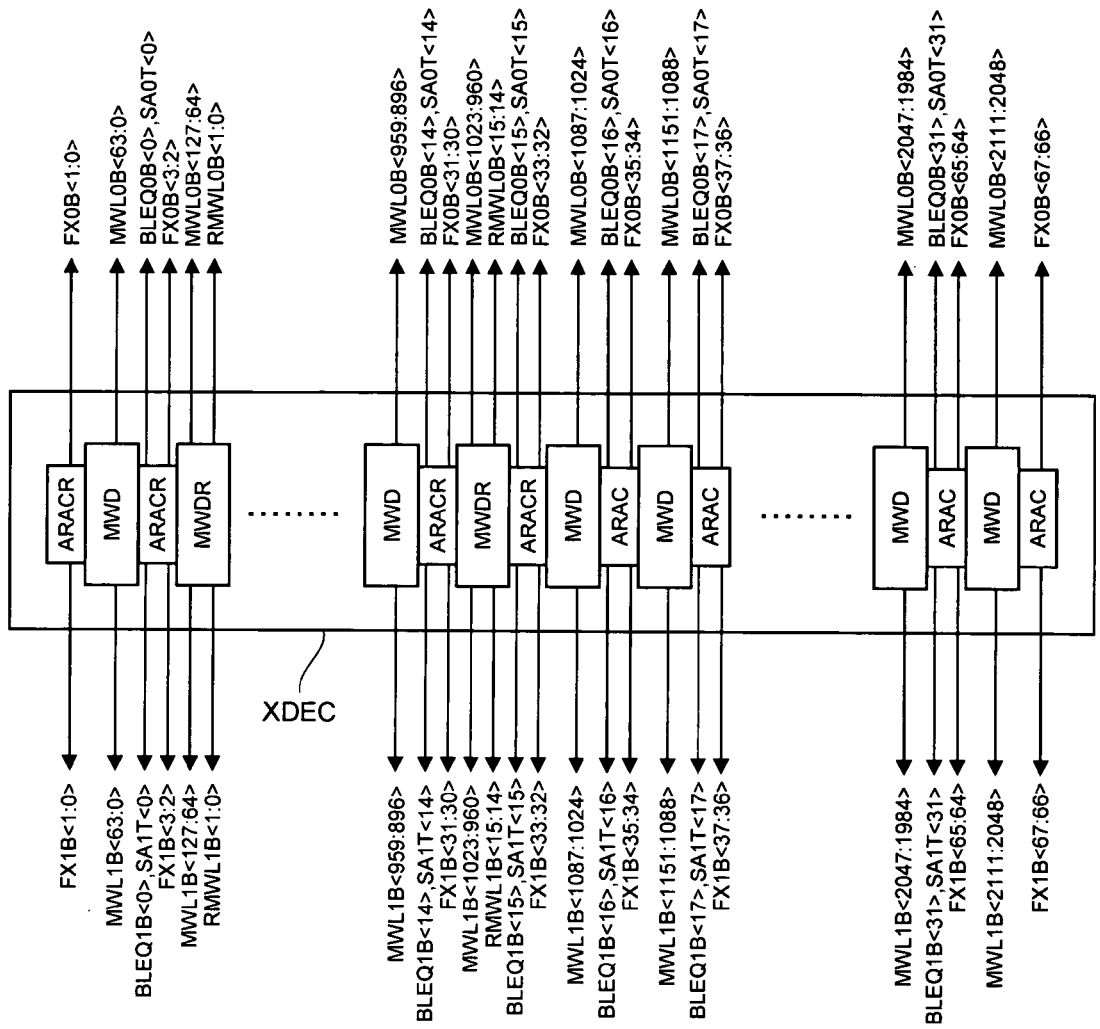
FIG. 18 is a schematic diagram showing the layout of the circuits constituting a row main decoder XDEC shown in FIG. 16.

FIG. 18 is a schematic diagram showing the layout of the circuits constituting the row main decoder XDEC.

As shown in FIG. 18, the row main decoder XDEC is configured by 33 main word drivers MWD and MWDR and the control circuits ARAC and ARACR arranged between the adjacent driver circuits. The circuit configuration of these main word drivers MWD and MWDR, as well as that of control circuits ARAC and ARACR, is as shown in FIG. 7 to FIG. 10, respectively.

The main word driver MWD is a circuit that drives 64 main word lines MWL0B and 64 main word lines MWL1B, respectively. In addition to these main word lines, the main word driver MWDR also drives two redundant main word lines RMWL0B and two redundant main word lines RMWL1B.

33 main word drivers MWD and MWDR respectively correspond to each row of memory mats MAT and RMAT shown in FIG. 16. Accordingly, the main word drivers MWDR are allocated to the rows corresponding to the memory mats RMAT that include the redundant sub-word lines RSWL. The main word drivers MWD are allocated to the other rows.

Figure 19:
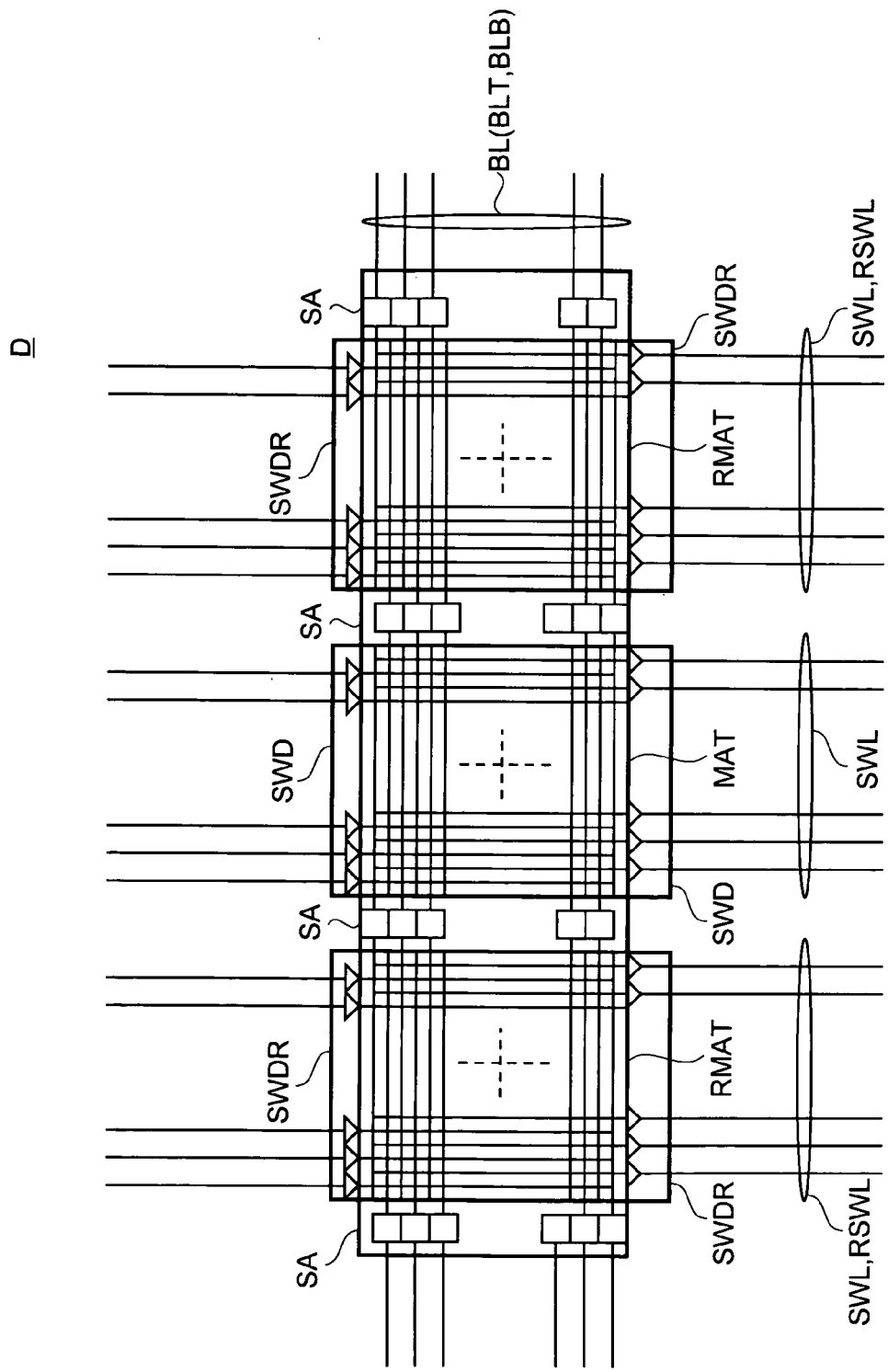
FIG. 19 is an explanatory diagram of the configuration of the memory mats MAT and RMAT.

FIG. 19 is an explanatory diagram of the configuration of the memory mats MAT and RMAT, and FIG. 19 is an enlarged view of a region D shown in FIG. 16.

As shown in FIG. 19, a plurality of sense amplifiers SA are arranged between the memory mats MAT and RMAT adjacent in the column direction. As shown with the help of FIG. 13, the sense amplifier SA is a circuit connected to a pair of bit lines BLT and BLB that amplifies their potential difference. The semiconductor memory device has a so-called open-bit type layout, and accordingly, these pairs of bit lines BLT and BLB are allocated to the memory mats MAT and RMAT different to each other. That is, the two adjacent memory mats share the same sense amplifier.

A sub-word driver SWD is arranged in the row direction of the memory mat MAT, and a sub-word driver SWDR is arranged in the row direction of the memory mat RMAT. The circuit configurations of sub-word drivers SWD and SWDR are as shown in FIG. 11 and FIG. 12, respectively.

According to such a layout, when the sub-word line SWL belonging to a certain memory mat MAT or RMAT is selected, a bit line BL belonging to the adjacent memory mat MAT or RMAT is used as the reference-side bit line. In consideration of this point, in the present embodiment, the corresponding repair-source memory mat and repair-destination memory mat are differed, and allocated in a manner that they are not adjacent to each other. The "repair-source memory mat" indicates a memory mat MAT or RMAT corresponding to a defective address stored in the fuse hit 310, and the "repair-destination memory mat" indicates a memory mat RMAT accessed by a mishit signal PRMIST that is activated by the defective address.

Accordingly, as the replacement destination of the central memory mat MAT shown in FIG. 19, a memory mat RMAT other than the left and right memory mats RMAT adjacent in the column direction (that is, another memory mat RMAT that is not shown in FIG. 19) is allocated. The reason for adopting such an allocation is that an access to the normal memory cell MC corresponding to the row address RA is executed in parallel, without waiting for the determining operation of the repair determining circuit 300.

That is, in the present embodiment, there is a period during which both the repair-source sub-word line SWL and the repair-destination redundant sub-word line RSWL are activated when a defective address is detected by the repair determining circuit 300, and thus it is definitely not possible to allocate both in the same memory mat, and it is not possible to allocate them in the adjacent memory mats sharing the same sense amplifier SA, either. This is because when such an allocation is adopted, the two sub-word lines (the repair-source sub-word line SWL and the repair-destination redundant sub-word line RSWL) are selected simultaneously for a pair of bit lines BLT and BLB. To avoid such abnormality, the above allocation is adopted in the present embodiment.

Figure 20:
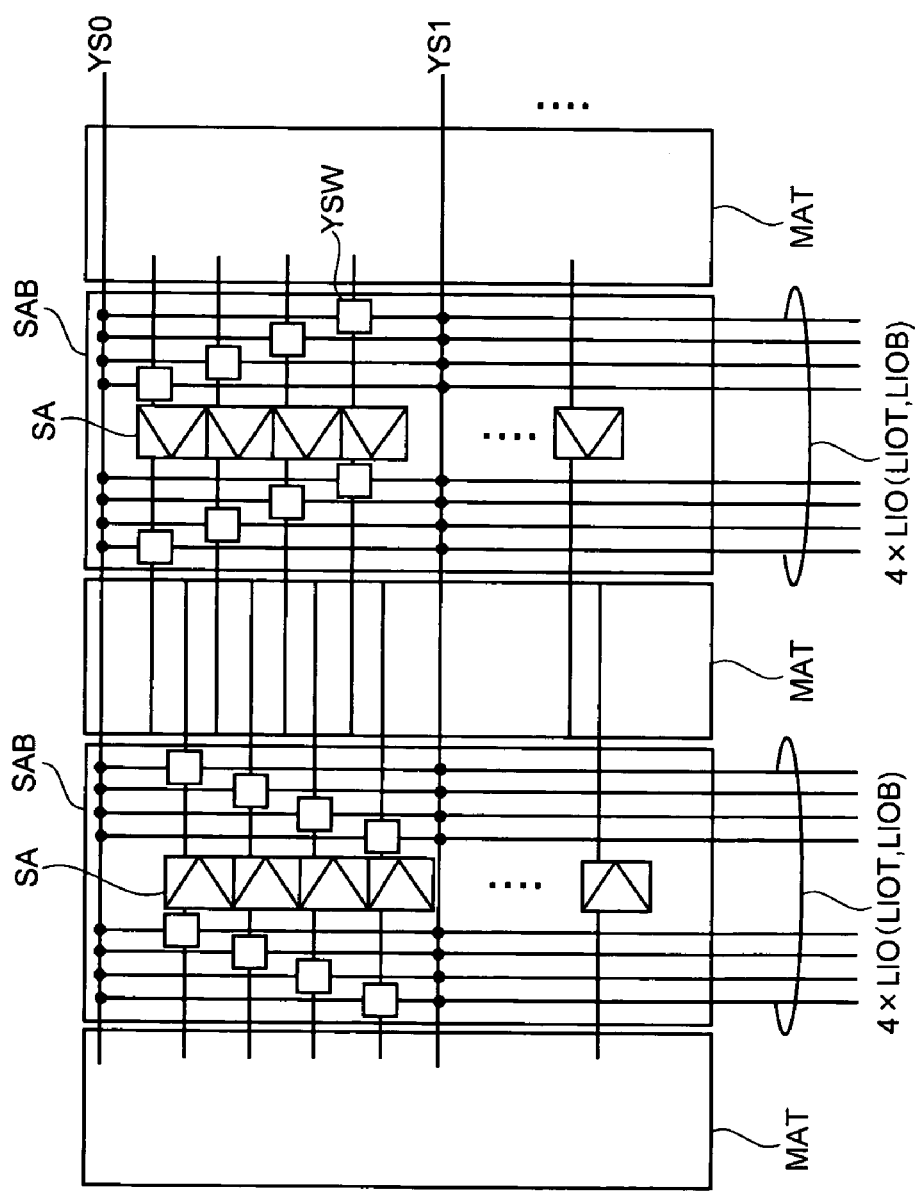
FIG. 20 is a circuit diagram of a Y switch.
Figure 21:
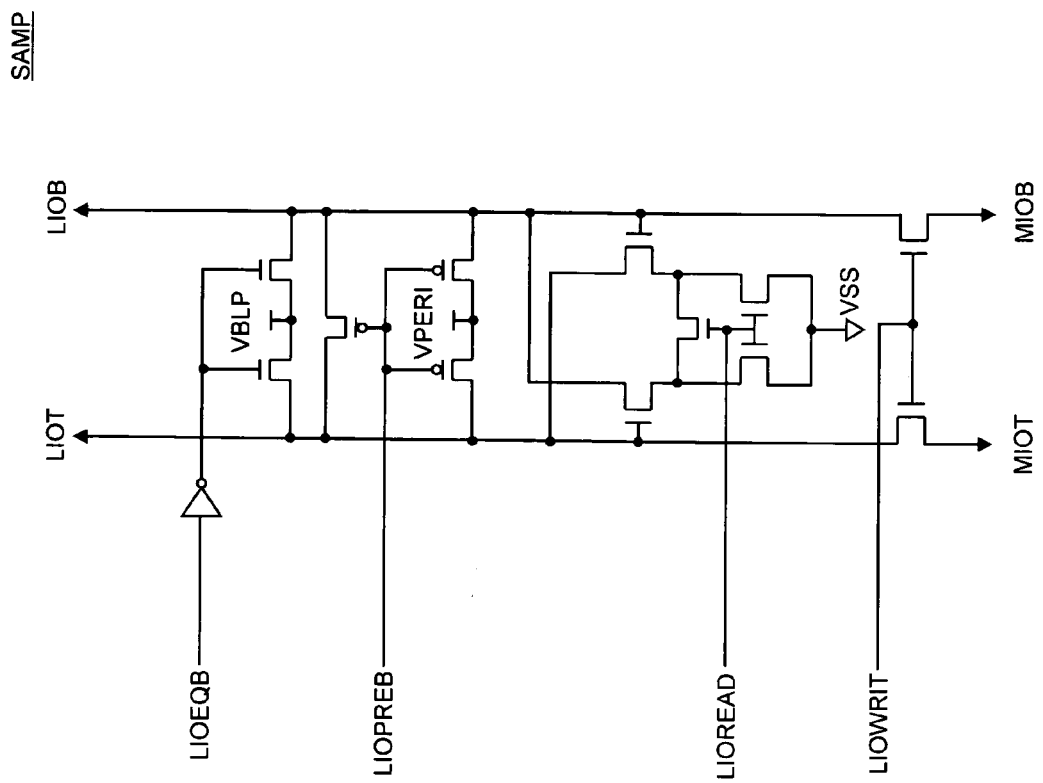
FIG. 21 is a circuit diagram of a sub-amplifier.

The output of the sense amplifier SA is supplied to a local I/O line LIO via a Y switch YSW shown in FIG. 20. In the example shown in FIG. 20, a single sense amplifier block is connected to four pairs of local I/O lines LIO (LIOT and LIOB) by the Y switch YSW. The read data supplied to the local I/O line LIO is supplied to a main I/O line MIO via a sub-amplifier SAMP shown in FIG. 21. In the sub-amplifier SAMP shown in FIG. 21, when the memory mats are not selected, signals LIOEQB, LIOREAD, and LIOWRIT are at a low level while the signal LIOPREB is at a high level. On the other hand, when the memory mats are selected, the signal LIOEQB becomes high level, and the signals LIOPREB, LIOREAD, and LIOWRIT are used to perform control. The main I/O line MIO connected to the local I/O line LIO by the sub-amplifier SAMP is connected to a read-write amplifier RWAMP, as described above.

An example of the preferred layout on the chips of the semiconductor memory device is as described above.

Figure 22:
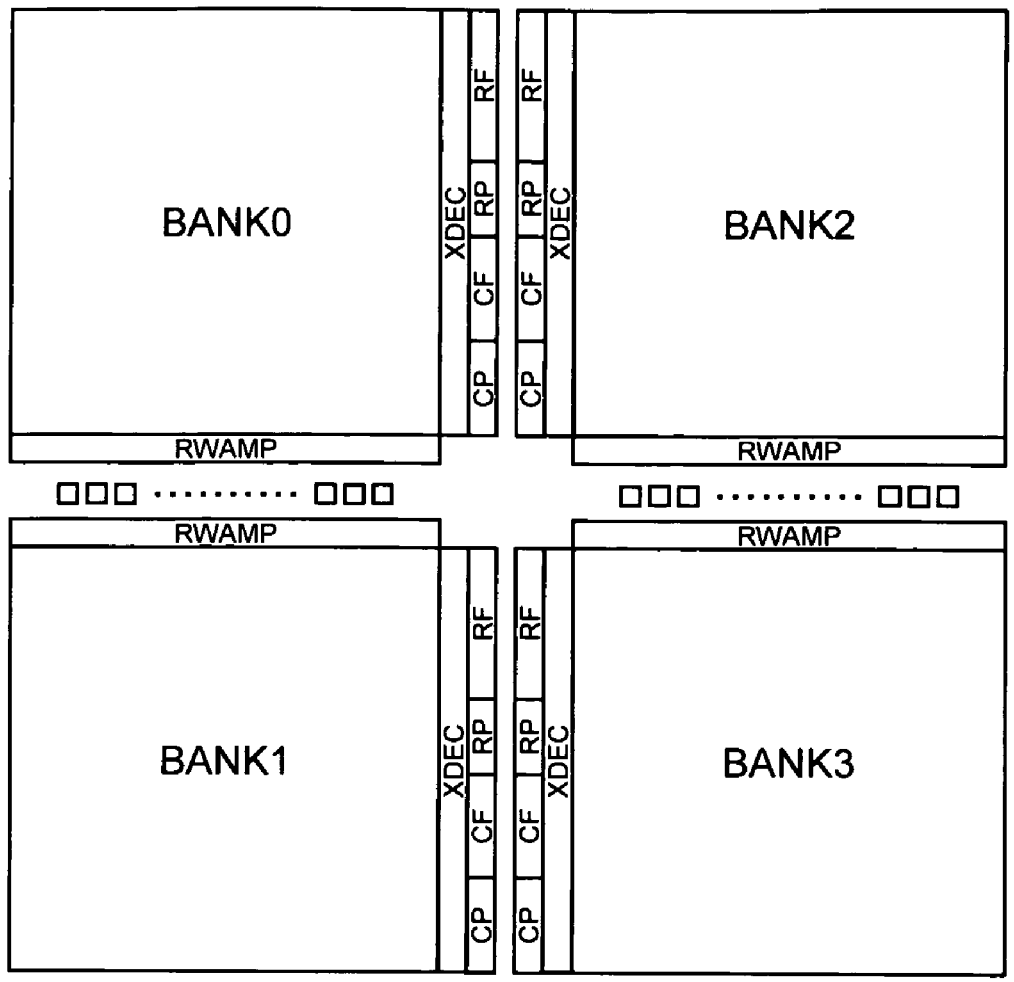
FIG. 22 is a schematic plan view for explaining another example of a preferred layout on the chips of the semiconductor memory device.

FIG. 22 is a schematic plan view for explaining another example of the preferred layout on the chips of the semiconductor memory device.

In the example shown in FIG. 22, the memory cell array 700 is divided into four banks from BANK0 to BANK3. The row main decoder XDEC is arranged along a first side (side in the column direction) of the memory cell array, and the read-write amplifier RWAMP is arranged along a second side (side in the row direction) orthogonal to the first side of the memory cell array.

Also in this example, the repair determining circuit RF and the row predecoder RP are arranged in parallel, and the distance from the row main decoder XDEC is set substantially the same. However, contrary to the layout shown in FIG. 15, the row main decoder XDEC and the repair determining circuit RF, and the row predecoder RP are arranged adjacently, and no read-write amplifier RWAMP or the like exists therebetween.

According to this layout, the distance between the row main decoder XDEC and the repair determining circuit RF, and the row predecoder RP is shortened considerably, and thus the load capacitance of the wiring connecting these is substantially reduced, enabling not only a higher-speed access but also a reduction in the power consumption. Moreover, due to the fact that no read-write amplifier RWAMP exists between the row main decoder XDEC, and the repair determining circuit RF and the row predecoder RP, there is no need to route wirings for the predecode signals and the redundant signals to avoid the read-write amplifier RWAMP.

Thus, according to the layout shown in FIG. 22, it is possible to achieve a higher speed access and reduced power consumption.

The operation of the semiconductor memory device is described next.

Figure 23:
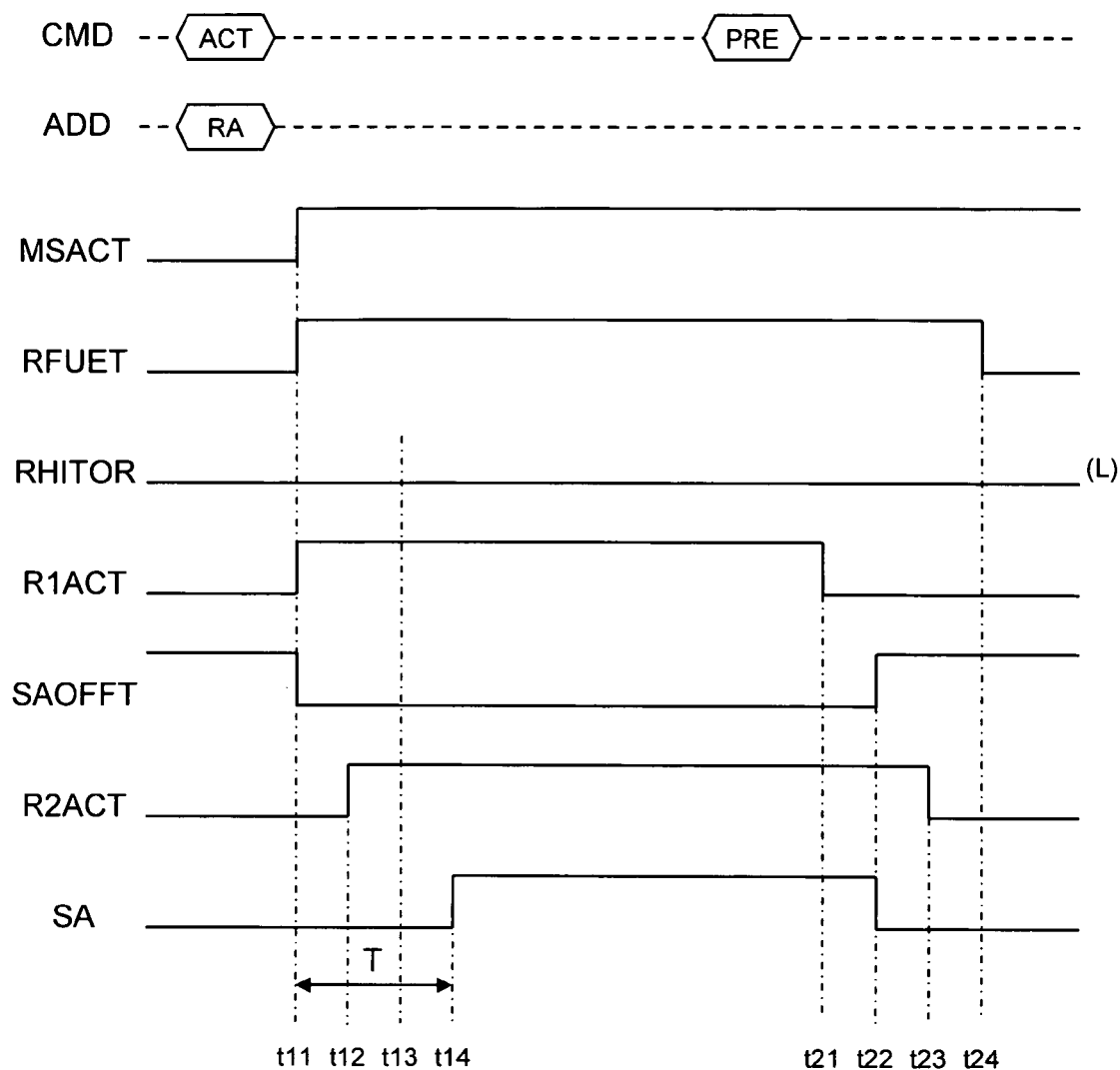
FIG. 23 is a timing chart for explaining the operation when a defective address is not detected during the normal operation.

FIG. 23 is a timing chart for explaining the operation when a defective address is not detected during the normal operation.

First, as shown in FIG. 23, when the row address RA is inputted simultaneously of the issuance of the active command ACT, an active signal MSACT, a fuse enable signal RFUET, and a timing signal R1ACT are activated, and a sense stop signal SAOFFT is non-activated at time t11. Thereby, the determining operation by the repair determining circuit 300 is started, and also precharging of nodes A0, A1, . . . within the main word driver 500 is stopped. The change timing of these signals needs not to match completely, and these signals can change sequentially with a predetermined time difference.

A certain amount of time is taken for the determining operation by the repair determining circuit 300, and thus the level of the hit signal RHITOR is not finalized at this point.

The timing signal R2ACT is activated next at time t12. Thereby, the discharge of nodes A0, A1, . . . within the main word driver 500 is allowed. Thus, when predecode signals RF2T, RF5T, RF8T, RF11T, and RF13T are finalized, any one of the main word lines MWL0B is activated.

Further, in response to the activation of the timing signal R2ACT, the non-activation of an equalize signal BLEQ0B by an array control circuit 600, and the activation of a sub-word-line selection signal FX0B are allowed. Thus, when predecode signals RF0B, RF8T, RF11T, and RF13T are finalized, together with the non-activation of the predetermined equalize signal BLEQ0B, the sub-word-line selection signal FX0B is activated.

Thereby, the sub-word lines SWL corresponding to the row address RADT are activated, and the corresponding normal memory cells MC are selected. However, even at this point, the level of the hit signal RHITOR is not finalized. Thus, it is probable that the activated main word lines MWL0B is the main word lines MWL0B corresponding to the defective address, and the activated sub-word lines SWL is the sub-word lines SWL corresponding to the defective address. In this way, irrespective of whether the row address RADT is defective, the sub-word driver SWD preferentially accesses the normal memory cell MC.

Thereafter, the determining operation by the repair determining circuit 300 is completed at time t13, and the level of the hit signal RHITOR is finalized. FIG. 23 shows the operation when a defective address is not detected, and thus the hit signal RHITOR maintains a low level even at time t13. Accordingly, operations such as resetting of the main word line MWL0B and the sub-word-line selection signal FX0B are not performed, and the access operation is continued as it is.

Thereafter, the driver circuit 740 within the sense amplifier SA is activated at time t14, and the sense operation is started. Thereby, reading or writing of the data from and to the selected normal memory cell MC is executed.

As described above, in the present embodiment, the access to the normal memory cells MC corresponding to row addresses RA is executed without waiting for the determining operation by the repair determining circuit 300. That is, the determining operation by the repair determining circuit 300 and the actual access operation to the normal memory cells MC are executed in parallel. Thereby, the period T1 from the supply of the row address RA until the activation of the sense amplifier SA can be shortened. Accordingly, the period (tRCD) from inputting of the active command until inputting of the read or write command can be shortened, and the speed of the random RAS access can be accelerated.

Figure 24:
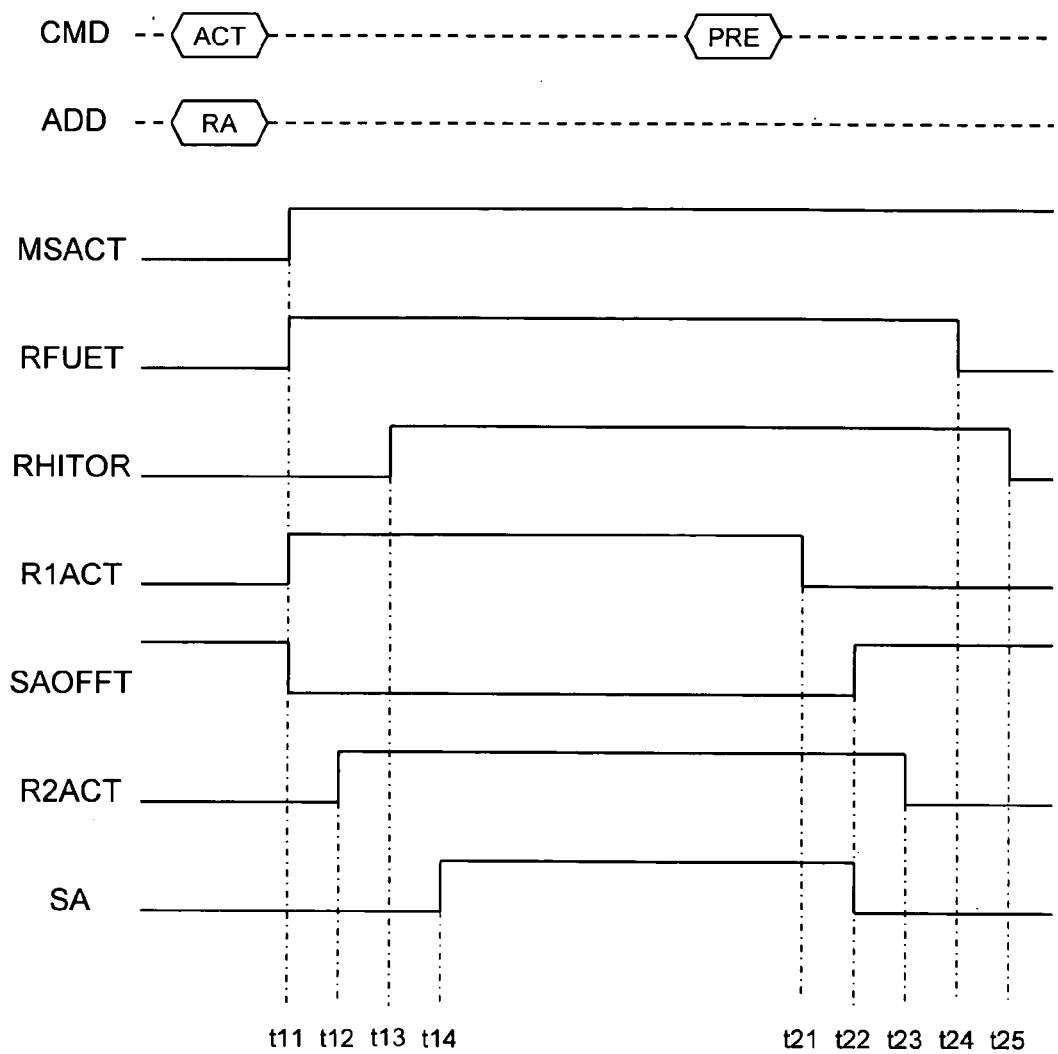
FIG. 24 is a timing chart for explaining the operation when a defective address is detected during the normal operation.

FIG. 24 is a timing chart for explaining the operation when a defective address is detected during the normal operation.

As shown in FIG. 24, as a result of the determining operation by the repair determining circuit 300, when it is detected that the row address RADT is a defective address, any one of the mishit signals RRMIST is non-activated, and the hit signal RHITOR is changed to high level at time t13.

Thereby, the main word drivers MWD and MWDR again return the nodes A0, A1, ... that are already discharged at time t12 to the precharged state. That is, the main word line MWL0B that is activated preferentially is reset. Any one of the redundant signals RREDMSB is activated, and thus the discharge of the nodes B0 and B1 within the main word driver MWDR is allowed, and any one of the redundant main word lines RMWL0B is activated.

Thereby, the sub-word line SWL corresponding to the row address RADT; i.e., the repair-source sub-word line SWL is reset, and in place thereof, the sub-word driver SWDR activates the repair-destination redundant sub-word line RSWL.

As described above, the memory mat RMAT to which the repair-destination redundant sub-word line RSWL belongs is that which is different from the memory mats MAT and RMAT to which the repair-source sub-word line SWL belongs and which are not adjacent to one another. Thus, the two sub-word lines (the repair-source sub-word line SWL and the repair-destination redundant sub-word line RSWL) are not selected for a pair of bit lines BLT and BLB, and the replacement operation can be performed correctly.

When the sense operation is started at time t14, reading or writing of the data from or to the redundant memory cell RMC is executed.

In the present embodiment, the repair-source sub-word lines SWL are activated once, and thus the data of the memory cells MC connected to these sub-word lines SWL are destructed. However, since these memory cells MC are not in use (cannot be accessed), even when the data is destruction, there is no problem. From this viewpoint, it is not essential to reset the repair-source sub-word lines SWL before starting the sense operation, and as long as data does not collide on the local I/O lines LIO and main I/O lines MIO, the sense operation can be performed in both the repair destination as well as the repair source. However, when the sense operation is performed on the repair source, the unnecessary power consumption increases, and thus it is preferable to reset the repair-source sub-word lines SWL before starting the sense operation, as described in the present embodiment.

Figure 25:
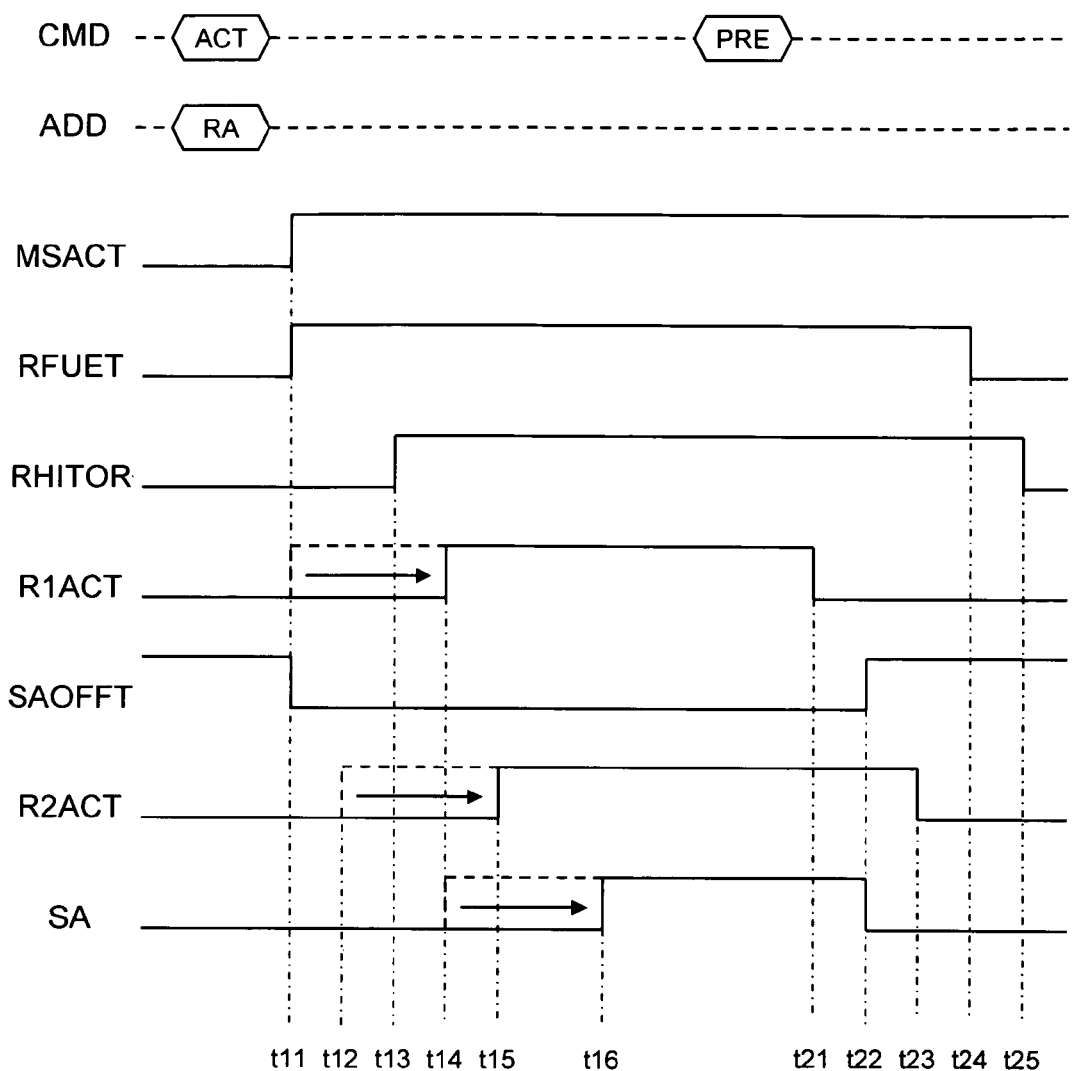
FIG. 25 is a timing chart for explaining the operation when the semiconductor memory device is in the refresh mode.

FIG. 25 is a timing chart for explaining the operation when the semiconductor memory device is in the refresh mode. Although FIG. 25 shows a case that a defective address is detected, except for the fact that the hit signal RHITOR is fixed at low level, the same applies to the case that a defective address is not detected.

As shown in FIG. 25, during the refresh operation, the activation of timing signals R1ACT and R2ACT is delayed for a certain time period. Specifically, these timing signals R1ACT and R2ACT are activated after the lapse of the time t13 when the level of the hit signal RHITOR is determined. As shown in FIG. 25, the timing signal R1ACT is activated at time t14, and the timing signal R2ACT is activated at time t15. Along with this, the start timing of the sense operation is also delayed up to time t16. Such a delay is caused by the operation of the clock control circuit 200 shown in FIG. 3.

Thereby, during the refresh operation, the sub-word lines SWL or the redundant sub-word lines RSWL are selected after the level of the hit signal RHITOR is finalized. That is, similar to a general semiconductor memory device, the sub-word lines SWL or the redundant sub-word lines RSWL are activated after waiting for the result of the determining operation by the repair determining circuit 300. Accordingly, when the row address RADT is a defective address, the sub-word driver SWD does not execute the access to the normal memory cell MC.

As described above, during the refresh operation in which a high-speed access is not requested, the parallel operation is not performed, and the sub-word lines SWL or the redundant sub-word lines RSWL are activated after waiting for the result of the determining operation by the repair determining circuit 300. Thus, the power consumption during the refresh operation can be reduced. Stopping the parallel operation in this way can be performed not only during the refresh operation, but also during various operation modes (such as the test mode) in which a high-speed access is not requested.

As described above, according to the present embodiment, the access to the normal memory cell MC corresponding to the row address RA is executed without waiting for the determining operation by the repair determining circuit 300, and thus the period T1 from the supply of the row address RA until the activation of the sense amplifier SA can be shortened. Thus, the period (tRCD) from inputting of the active command until inputting of the read or write command can be shortened.

Furthermore, the memory mats RMAT that are different from the repair-source memory mats MAT and RMAT and that are not adjacent are allocated as the repair-destination memory mats. Accordingly, even when the access to the normal memory cell MC is preferentially attempted, the read operation and write operation can be correctly performed.

Further, as in the refresh operation, because the parallel operation is stopped in operation modes in which the high-speed access is not requested, the power consumption in such operation modes can be also reduced.

In the present embodiment, the row predecoder RP and the repair determining circuit RF are arranged adjacent to each other, thereby resulting in the layout in which the distance from the row predecoder RP to the row main decoder XDEC and that from the repair determining circuit RF to the row main decoder XDEC are substantially the same. Thus, the high-speed access can be performed effectively by the parallel operation.

Figure 26:
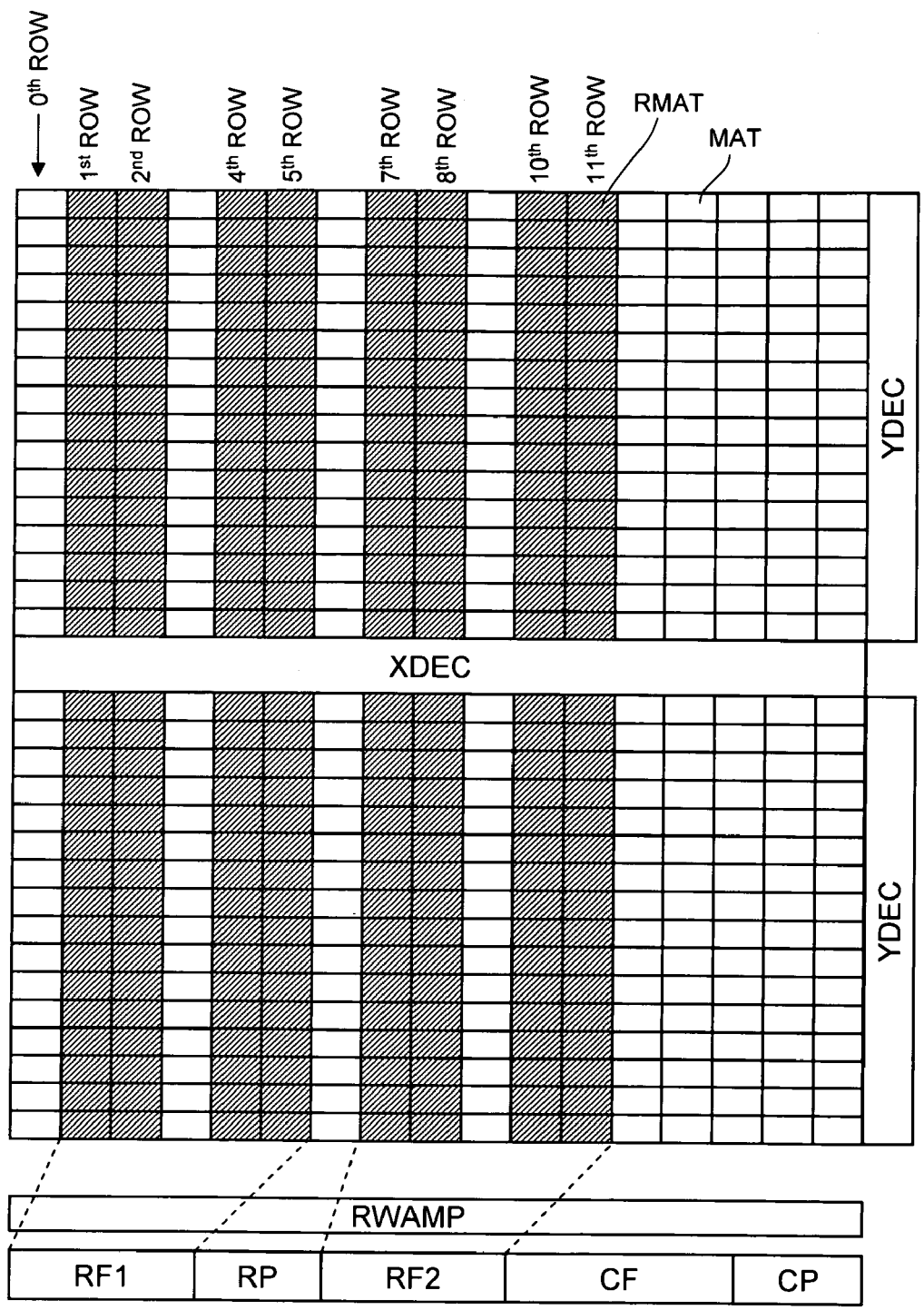
FIG. 26 is a schematic diagram for explaining another example of the memory mat configuration in each bank.

FIG. 26 is a schematic diagram for explaining another example of the memory mat configuration in each bank.

In the example shown in FIG. 26, each bank is divided into two by the row main decoder XDEC, and each part is configured by the memory mats MAT or RMAT of 17 rows×16 columns. Among the memory mats shown in FIG. 26, those shown as shaded are the memory mats RMAT that include the redundant sub-word lines RSWL, and the rest are the memory mats MAT that do not include the redundant sub-word lines RSWL. Five hundred twelve sub-word lines SWL and 512 bit lines BL are allocated to one memory mat MAT, and the normal memory cells MC are arranged at their cross points. In contrast, eight redundant sub-word lines RSWL are added to a memory mat RMAT, and redundant memory cells RMC are arranged at the cross points of the redundant sub-word lines RSWL and bit lines BL.

That is, as compared to the example shown in FIG. 16, in the example shown in FIG. 26, the number of the sub-word lines SWL included in a single memory mat is increased from 256 to 512. Thereby, the number of sense amplifiers is reduced by half, so that the chip area can be compressed. However, as compared to the example shown in FIG. 16, the bit line capacitance increases, and thus the access speed is slightly lowered.

In this example, when it is assumed the leftmost row as a row number 0, the memory mats RMAT that include the redundant sub-word lines RSWL are arranged in first, second, fourth, fifth, seventh, eighth, tenth, and eleventh rows. That is, three memory mats including two adjacent memory mats RMAT and one memory mat MAT are provided as one set, and these sets are arranged repeatedly.

In this example, the repair determining circuit RF is divided into two, i.e., repair determining circuits RF1 and RF2, and while the repair determining circuit RF1 is allocated to the memory mats RMAT of the first, second, fourth, and fifth rows, the repair determining circuit RF2 is allocated to the memory mats RMAT of the seventh, eighth, tenth, and eleventh rows. The row predecoder RP is arranged between these two repair determining circuits RF1 and RF2. According to this layout, a nearly linear layout can be achieved, without having to route the wiring for redundant signals.

Figure 27:
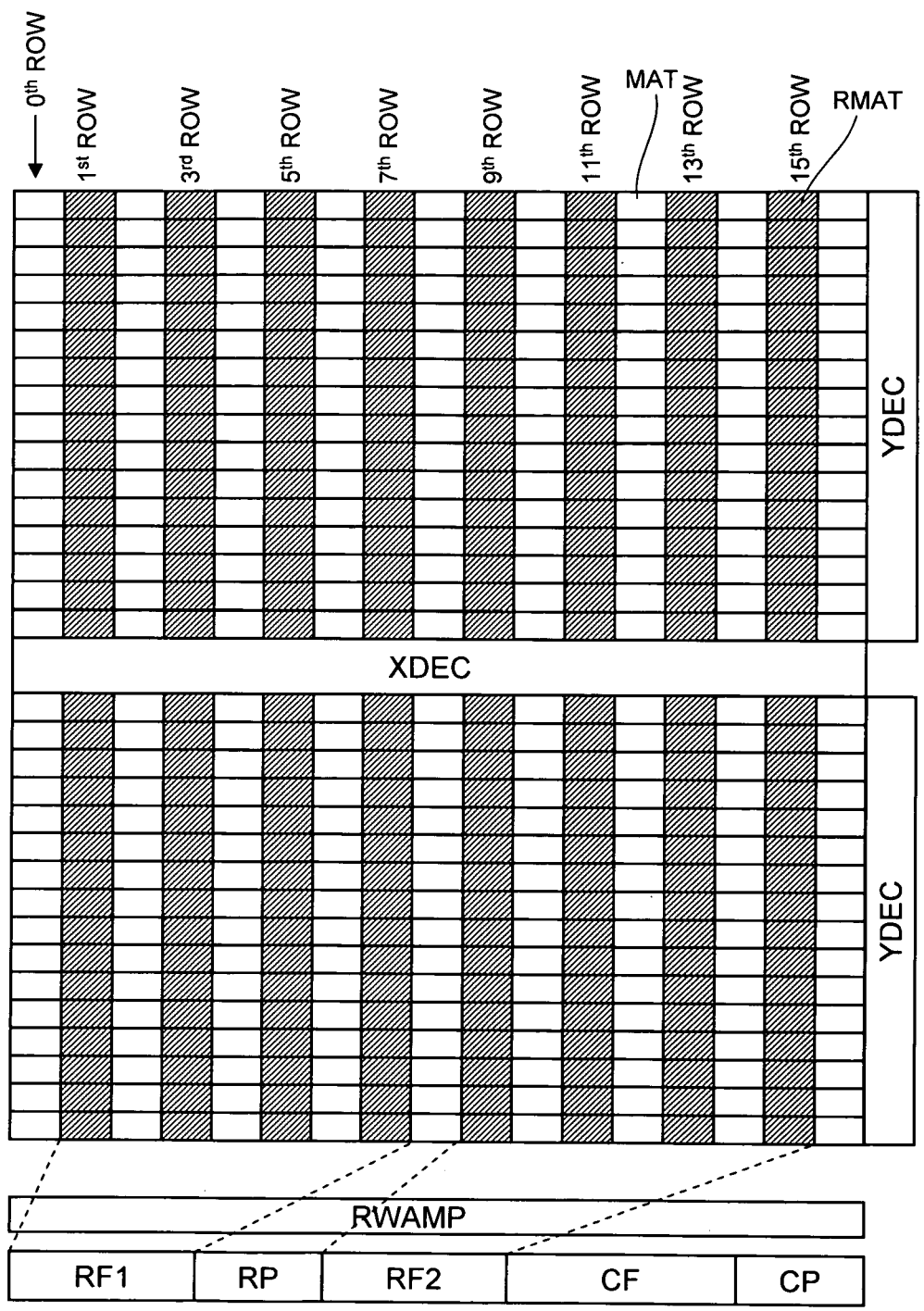
FIG. 27 is a schematic diagram for explaining still another example of the memory mat configuration in each bank.

That is, as shown in FIG. 27, similar to the example shown in FIG. 16, when the memory mats RMAT are arranged in the first, third, fifth, seventh, ninth, eleventh, thirteenth, and fifteenth rows, the positions in the column direction of the memory mats RMAT are dispersed, and this results in a longer length of the wiring of the redundant signals.

Figure 28:
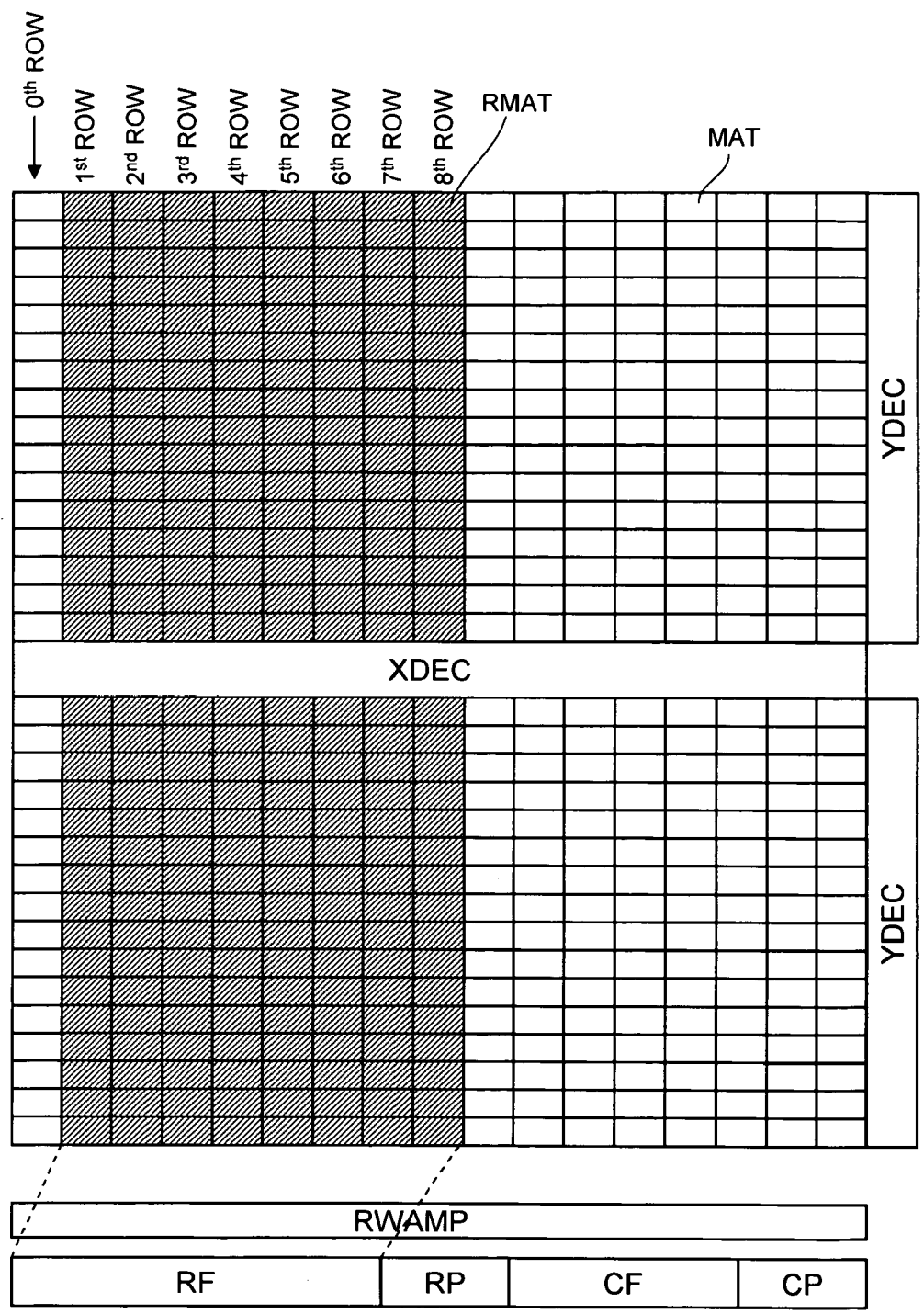
FIG. 28 is a schematic diagram for explaining still another example of the memory mat configuration in each bank.

First, as shown in FIG. 28, when the memory mats RMAT are arranged in the first to eighth rows, the memory mats RMAT can be distributed unevenly in the left area of the memory cell array. However, in such a case, the repair efficiency declines. That is, when it is assumed that the repair-source memory mat is in the second row, the memory mats RMAT in the adjacent first and third rows cannot be selected as the repair destination, and thus the repair-destination memory mat RMAT is limited to the memory mats RMAT in the fourth to eighth rows (40 redundant sub-word lines RSWL).

Figure 29:
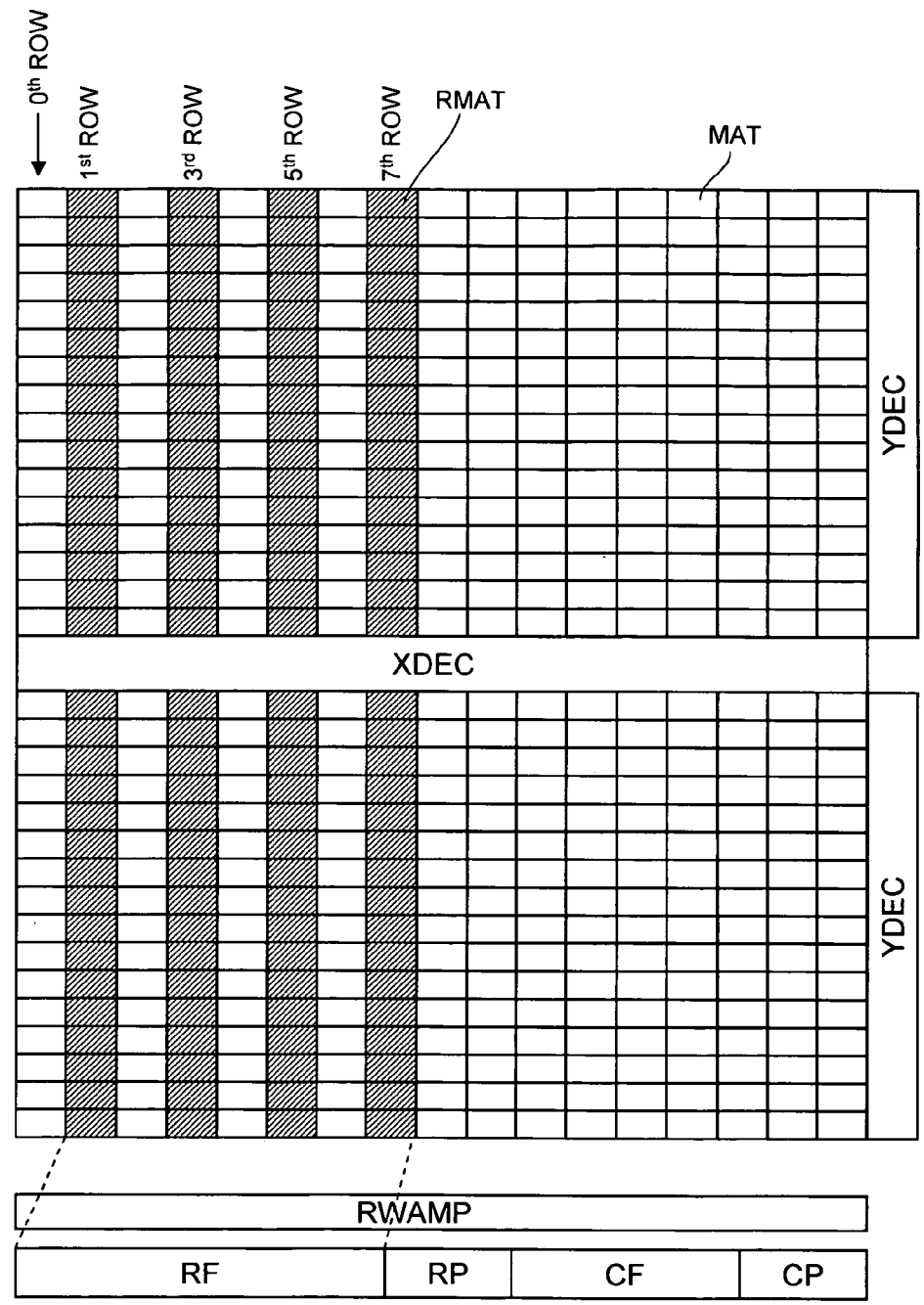
FIG. 29 is a schematic diagram for explaining still another example of the memory mat configuration in each bank.

When the number of the redundant sub-word lines RSWL allocated to a single memory mat RMAT is increased from 8 to 16, the memory mats RMAT can be unevenly distributed in the left area of the memory cell array, as shown in FIG. 29. However, in such a case, the repair efficiency declines further. That is, when it is assumed that the repair-source memory mat is in the second row, the memory mats RMAT in the adjacent first and third rows cannot be selected as the repair destination, and thus the repair-destination memory mat RMAT is limited to the memory mats RMAT in the fifth and seventh rows (32 redundant sub-word lines RSWL).

In contrast, when the layout shown in FIG. 26 is adopted, it becomes possible to secure high repair efficiency while preventing routing the wiring of the redundant signals. That is, when it is assumed that the repair-source memory mat is in the third row, the memory mats RMAT in the adjacent second and fourth rows cannot be selected as the repair destination. However, because the repair-destination memory mat RMAT can be selected from the memory mats RMAT in the first, fifth, seventh, eighth, tenth, and eleventh rows, 48 redundant sub-word lines RSWL can be used.

Figure 30:
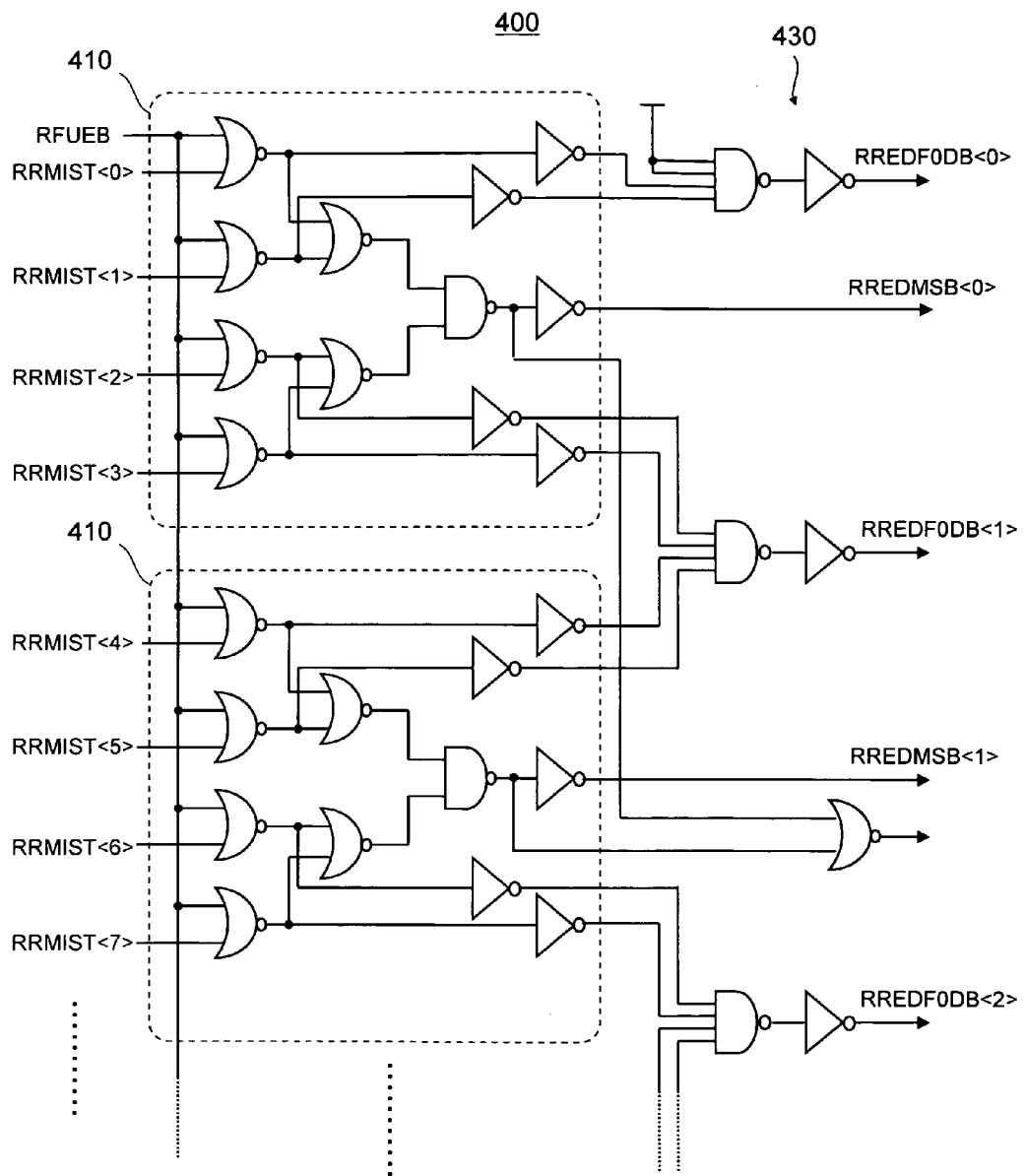
FIG. 30 is a circuit diagram of the repair address decoder when the layout shown in FIG. 26 is adopted.

FIG. 30 is a circuit diagram of the repair address decoder 400 when the layout shown in FIG. 26 is adopted.

In the example shown in FIG. 16, the output signal of the repair address decoder 400 is supplied as it is to the row main decoder XDEC. However, when the layout shown in FIG. 26 is adopted, a logic gate 430 with up to two levels needs to be present in the output signal of the repair address decoder 400, as shown in FIG. 30. This is because in contrast to the alternate arrangement of the memory mats MAT and RMAT in the layout shown in FIG. 16, the memory mats MAT are arranged in every third row in the layout shown in FIG. 26.

As shown in FIG. 30, when the layout shown in FIG. 26 is adopted, the number of logic gates slightly increases. However, as is obvious from FIG. 30, the number of logic levels in each signal path is all within four, and this feature remains the same in comparison with the maximum number of logic levels when the layout shown in FIG. 16 is adopted (see FIG. 6). Accordingly, despite the fact that the number of logic gates increases, there is no change in the maximum number of logic levels, and thus the access speed is not lowered due to an increase in the number of logic gates.

It is apparent that the present invention is not limited to the above embodiments, but may be modified and changed without departing from the scope and spirit of the invention.

In the above embodiment, the present invention is applied to the DRAM as an example. However, an application target of the present invention is not limited thereto, and the present invention can be also applied to other types of semiconductor memory devices such as a flash memory, a phase change memory (PRAM), and a variable resistance memory (RRAM).

In the present embodiment, both the sub-word lines SWL corresponding to the defective normal memory cells MC, and the redundant sub-word lines RSWL corresponding to the redundant memory cells RMC are activated. However, this is not essential in the present invention. That is, although the parallel operation is performed partially, as in the semiconductor memory device of Japanese Patent Application Laid-open No. 2000-293998, when a defective address is detected by the repair determining circuit, a method in which the access to the normal memory cell is not executed can be used. In such a case, any memory mat can be allocated as the repair destination, and it is not necessary to allocate a memory mat that is different from the repair-source memory mat and that is not adjacent, as described in the above embodiment.

In the above embodiment, a memory mat that is different from the repair-source memory mat and that is not adjacent is allocated as the repair-destination memory mat. However, as in a folded-bit type layout, in a case of a circuit configuration in which the same sense amplifier is not shared between the two adjacent memory mats, any memory mat can be allocated as the repair-destination memory mat as long as it is different from the repair-source memory mat. That is, in the present invention, it is not essential to allocate the memory mat not adjacent to the repair-source memory mat as the repair-destination memory mat.

In the above embodiment, when the row address RADT is a defective address, access to the normal memory cell is interrupted in the middle. However, as long as there is no collision of data on the I/O lines or the like, it is not essential to interrupt the access to the normal memory cell in the middle.

What is claimed is:

1. A semiconductor memory device comprising:
a memory cell array including a normal memory cell and a redundant memory cell that replaces the normal memory cell when it is defective;
a first sub-word driver that selects the normal memory cell;
a second sub-word driver that selects the redundant memory cell;
a predecoder that predecodes an address to which access is requested irrespective of whether the address is a defective address;
a main decoder that controls the first and second sub-word drivers based on a predecode signal generated by the predecoder; and
a repair determining circuit that determines whether the address to which access is requested is the defective address, wherein a physical layout of the semiconductor memory device includes:

the predecoder and the repair determining circuit having a shape in which a first direction is set to be a longitudinal direction, and the predecoder and the repair determining circuit are arranged adjacent to each other in the first direction, and are arranged in parallel with the main decoder, wherein the main decoder includes a plurality of first and second main word drivers that control the first and second subword drivers, respectively, the repair determining circuit includes a plurality of fuse sets each corresponding to an associated one of the second main word drivers, positions of the corresponding second main word driver and fuse set in the first direction are substantially matched, the memory cell array is divided into a plurality of memory mats, and wiring that connects the second main word driver and the fuse set is arranged on the corresponding memory mat.

2. The semiconductor memory device as claimed in claim 1, wherein the memory mats are classified into a first memory mat not including the redundant memory cell and a second memory mat including the redundant memory cell, and the first memory mat and the second memory mat are arranged alternately in the first direction.

3. The semiconductor memory device as claimed in claim 1, wherein the memory mats are classified into a first memory mat not including the redundant memory cell and a second memory mat including the redundant memory cell, and three memory mats formed by the one first memory mat and the two adjacent second memory mats are provided as one set, and the set is repeatedly arranged in the first direction.

4. A semiconductor memory device comprising:

a memory cell array including a normal memory cell and a redundant memory cell that replaces the normal memory cell when it is defective;

a first sub-word driver that selects the normal memory cell;

a second sub-word driver that selects the redundant memory cell;

a predecoder that predocodes an address to which access is requested irrespective of whether the address is a defective address;

a main decoder that controls the first and second sub-word drivers based on a predecode signal generated by the predecoder; and a repair determining circuit that determines whether the address to which access is requested is the defective address, wherein the predecoder and the repair determining circuit having a shape in which a first direction is set to be a longitudinal direction, and the predecoder and the repair determining circuit are arranged adjacent to each other in the first direction, and are arranged in parallel with the main decoder, wherein the main decoder includes a plurality of first and second main word drivers that control the first and second sub-word drivers, respectively, wherein the repair determining circuit includes a plurality of fuse sets each corresponding to an associated one of the second main word drivers, wherein positions of the corresponding second main word driver and fuse set in the first direction are substantially matched, wherein the memory cell array is divided into a plurality of memory mats, wherein wiring that connects the second main word driver and the fuse set is arranged on the corresponding memory mat, wherein the memory mats are classified into a first memory mat not including the redundant memory cell and a second memory mat including the redundant memory cell, wherein the first memory mat and the second memory mat are arranged alternately in the first direction, wherein the memory mats are classified into a first memory mat not including the redundant memory cell and a second memory mat including the redundant memory cell, wherein three memory mats formed by the one first memory mat and the two adjacent second memory mats are provided as one set, and the set is repeatedly arranged in the first direction, and wherein the repair determining circuit is divided into first and second portions, and the predecoder is arranged between the first and second portions of the repair determining circuit.

5. A semiconductor memory device comprising:

a memory cell array including a normal memory cell and a redundant memory cell that replaces the normal memory cell when it is defective;

a first sub-word driver that selects the normal memory cell;

a second sub-word driver that selects the redundant memory cell;

a predecoder that predocodes an address to which access is requested irrespective of whether the address is a defective address;

a main decoder that controls the first and second sub-word drivers based on a predecode signal generated by the predecoder; and a repair determining circuit that determines whether the address to which access is requested is the defective address, wherein a physical layout of the semiconductor memory device includes:

the predecoder and the repair determining circuit having a shape in which a first direction is set to be a longitudinal direction, and the predecoder and the repair determining circuit are arranged adjacent to each other in the first direction, and are arranged in parallel with the main decoder, wherein a distance from the predecoder to the main decoder is approximately equal to a distance from the repair determining circuit to the main decoder.

6. A semiconductor device, comprising:

a region including first and second sides opposed to each other;

a memory cell array formed in the region and including a plurality of memory cells;

a predecoder arranged along the first side of the region and producing a predecoded address by decoding an address;

a repair determining circuit arranged along the first side of the region and determining whether the address is defective or not; and a main decoder arranged along the second side of the region and decoding the predecoded address to access designated one or ones of the memory cells;

the memory cell array being positioned between the main decoder and each of the predecoder and the repair determining circuit.

7. The semiconductor device as claimed in claim 6, wherein the predecoder and the repair determining circuit are adjacent to each other.

8. The semiconductor device as claimed in claim 6, further comprising an additional region sandwiching the main decoder with the region and an additional memory cell array formed in the additional region, and the additional memory array including a plurality of memory cells.

9. The semiconductor device as claimed in claim 6, wherein the predecoder decodes the address irrespective of whether the address is defective or not and the main decoder decodes the predecoded address irrespective of whether the address is defective or not.

* * * * *